United States Patent
Jeon et al.

(10) Patent No.: US 12,433,103 B2
(45) Date of Patent: Sep. 30, 2025

(54) DISPLAY APPARATUS

(71) Applicant: Samsung Display Co., Ltd., Yongin-si (KR)

(72) Inventors: Joohee Jeon, Yongin-si (KR);
Donghwan Shim, Yongin-si (KR);
Seokhyun Lim, Yongin-si (KR);
Miyeon Cho, Yongin-si (KR); Gunhee Kim, Yongin-si (KR); Sunyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 570 days.

(21) Appl. No.: 17/847,041

(22) Filed: Jun. 22, 2022

(65) Prior Publication Data

US 2023/0006016 A1    Jan. 5, 2023

(30) Foreign Application Priority Data

Jul. 1, 2021   (KR) .................. 10-2021-0086710

(51) Int. Cl.
*H10K 59/121*   (2023.01)
*H10K 59/131*   (2023.01)

(52) U.S. Cl.
CPC ....... *H10K 59/1213* (2023.02); *H10K 59/131* (2023.02)

(58) Field of Classification Search
CPC ............ H10K 59/1213; H10K 59/131; H10K 59/123; H10K 59/00; G09G 3/3225; G09G 2300/0426
See application file for complete search history.

(56) References Cited

U.S. PATENT DOCUMENTS

| | | | |
|---|---|---|---|
| 10,134,826 | B2 | 11/2018 | Ka et al. |
| 10,297,655 | B2 | 5/2019 | Ka et al. |
| 11,832,479 | B2* | 11/2023 | Kang .............. H10K 59/40 |
| 2018/0151660 | A1* | 5/2018 | Kim ............... H10K 59/1216 |
| 2019/0221584 | A1* | 7/2019 | Kang .............. H01L 27/1255 |
| 2019/0229177 | A1* | 7/2019 | Kim ................ G09G 3/3275 |
| 2021/0202630 | A1* | 7/2021 | Jeon ............... H10K 50/844 |
| 2022/0310717 | A1* | 9/2022 | Sun ................ H10K 59/123 |

FOREIGN PATENT DOCUMENTS

| | | |
|---|---|---|
| CN | 110288945 A | 9/2019 |
| CN | 111063719 A | 4/2020 |
| KR | 10-2017-0066767 A | 6/2017 |
| KR | 10-2017-0117291 A | 10/2017 |

* cited by examiner

*Primary Examiner* — Dao H Nguyen
(74) *Attorney, Agent, or Firm* — Womble Bond Dickinson (US) LLP

(57) ABSTRACT

A display apparatus that is configured to prevent conductive patterns in a portion of a display area from being viewed under external light includes: a substrate including a display area and a peripheral area outside the display area, a semiconductor layer arranged on the substrate, a first pixel circuit arranged on the display area, a first data line arranged on the display area and connected to the first pixel circuit, a second pixel circuit arranged on the peripheral area, a second data line arranged on the peripheral area and connected to the second pixel circuit, and a data connection line arranged between the substrate and the semiconductor layer and connecting the first data line to the second data line.

21 Claims, 13 Drawing Sheets

DISPLAY APPARATUS

CROSS-REFERENCE TO RELATED APPLICATION

This application claims priority to and the benefit of Korean Patent Application No. 10-2021-0086710, filed on Jul. 1, 2021, in the Korean Intellectual Property Office, the disclosure of which is incorporated by reference herein in its entirety.

BACKGROUND

1. Field

One or more embodiments relate to a display apparatus.

2. Description of the Related Art

A display apparatus visually display images. A display apparatus is used as a display of miniaturized products, such as mobile phones, and a display of large-scale products, such as televisions.

A display apparatus includes a plurality of pixels that receive electric signals and emit light to the outside to display images. Each pixel includes a light-emitting element. For example, an organic light-emitting display apparatus includes an organic light-emitting diode OLED as a light-emitting element. Generally, an organic light-emitting display apparatus includes thin-film transistors and organic light-emitting diodes mounted over the substrate and operates as the organic light-emitting diodes spontaneously emit light.

The purpose of display apparatuses has been diversified, and various designs to improve the quality of display apparatuses have been developed. For example, various display apparatuses having excellent characteristics, such as relatively small thickness, relatively small weight, and relatively low power consumption have been introduced. In addition, a dead space of display apparatuses is gradually reduced and the area of a display area is gradually extended.

SUMMARY

One or more embodiments include a display panel including an extended display area such that images may be displayed even in a region in which a component, such as an electronic element, is arranged, and a display apparatus including the display panel. However, this is just an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate including a display area, and a peripheral area outside the display area, a semiconductor layer on the substrate, a first pixel circuit at the display area, a first data line at the display area, and connected to the first pixel circuit, a second pixel circuit at the peripheral area, a second data line at the peripheral area, and connected to the second pixel circuit, and a data connection line between the substrate and the semiconductor layer, and connecting the first data line to the second data line.

The display area may include a component area, and a main area surrounding at least a portion of the component area, wherein a transmittance of the component area is greater than a transmittance of the main area, and wherein the data connection line overlaps at least a portion of the component area.

The display apparatus may further include a camera below the component area, wherein the component area includes a central region corresponding to a lens of the camera, and an edge region surrounding the central region, and wherein the data connection line overlaps at least a portion of the edge region.

The data connection line may include a first part overlapping the component area, a second part connected to the first part, extending in a first direction, and overlapping at least a portion of the main area, and a third part connected to the second part, extending in a second direction, and overlapping at least a portion of the main area.

The display apparatus may further include a voltage line on the semiconductor layer, extending in the first direction, and connected to the first pixel circuit, wherein the second part of the data connection line overlaps at least a portion of the voltage line.

The display apparatus may further include a first display element at the display area, and connected to the first pixel circuit, wherein the first pixel circuit includes a driving transistor configured to control a current flowing through the first display element, and an initialization transistor connected to the voltage line, and configured to apply an initialization voltage from the voltage line to a gate of the driving transistor according to a scan signal.

A conduction type of the driving transistor may be opposite to a conduction type of the initialization transistor.

The first pixel circuit includes a plurality of first pixel circuits in a matrix shape, wherein the data connection line includes a plurality of data connection lines, wherein the second parts of the data connection lines are at respective rows of the first pixel circuits, and wherein the third parts of the data connection lines are at respective columns or at respective pairs of columns of the first pixel circuits.

The display apparatus may further include a subsidiary row line extending in the first direction, and including a first row connection part and a second row connection part spaced apart from each other with the third part of the data connection line therebetween, and a subsidiary column line extending in the second direction, and including a first column connection part and a second column connection part spaced apart from each other with the second part of the data connection line therebetween.

A driving voltage of a same level may be applied to each of the subsidiary row line and the subsidiary column line.

The display apparatus may further include a first display element at the display area and connected to the first pixel circuit, and a second display element at the display area and connected to the second pixel circuit, wherein an emission area of the second display element is greater than an emission area of the first display element.

The display apparatus may further include a third pixel circuit at the display area, and a third display element at the display area and connected to the third pixel circuit, wherein the display area includes a component area including a first region and a second region adjacent to each other, and a main area surrounding a portion of the component area, wherein the first pixel circuit and the first display element are at the main area, and partially overlap each other, wherein the second display element is at the first region of the component area, wherein the third pixel circuit and the third display element are at the second region of the component area, and partially overlap each other, and wherein an emission area of the third display element is greater than an emission area of the first display element.

The first display element may include a plurality of first display elements, wherein the second display element includes a plurality of second display elements, wherein the third display element includes a plurality of third display elements, wherein a number of the first display elements per unit area is greater than a number of the second display elements per unit area, and wherein the number of the second display elements per unit area is same as a number of the third display elements per unit area.

According to one or more embodiments, a display apparatus may include a substrate in which a display area, and a peripheral area that is outside the display area are defined, the display area including a component area, and a main area that surrounds at least a portion of the component area, first pixel circuits at the main area, first display elements at the main area, and respectively connected to the first pixel circuits, first data lines at the main area, and respectively connected to the first pixel circuits, second pixel circuits at the peripheral area, second display elements at the component area, and respectively connected to the second pixel circuits, second data lines at the peripheral area, and respectively connected to the second pixel circuits, and data connection lines overlapping at least a portion of the component area, and respectively connecting the first data lines and the second data lines, wherein a number of the first display elements per unit area is greater than a number of the second display elements per unit area.

The display apparatus may further include a camera below the component area, wherein the component area includes a central region corresponding to a lens of the camera, and an edge region surrounding the central region, and wherein the data connection lines overlap at least a portion of the edge region.

The data connection lines may include a first part overlapping the component area, a second part connected to the first part, extending in a first direction, and overlapping at least a portion of the main area, and a third part being connected to the second part, extending in a second direction, and overlapping at least a portion of the main area.

The display apparatus may further include voltage lines at the main area, extending in the first direction, and respectively connected to the first pixel circuits at a same row, wherein the second parts respectively overlap at least a portion of the voltage lines.

The first pixel circuits may include a driving transistor configured to control a current flowing through a corresponding first display element among the first display elements, and an initialization transistor configured to transfer an initialization voltage from a corresponding voltage line among the voltage lines to a gate of the driving transistor according to a scan signal.

The second parts may be are respectively at rows of the first pixel circuits, and wherein the third parts are either respectively at columns of the first pixel circuits or respectively at pairs of adjacent columns of the first pixel circuits.

The display apparatus may further include subsidiary row lines extending in the first direction, and including row connection parts spaced apart from each other with a corresponding third part therebetween, and subsidiary column lines extending in the second direction, and including column connection parts spaced apart from each other with a corresponding second part therebetween, wherein a driving voltage of a same level is applied to the subsidiary row lines and the subsidiary column lines.

A number of the row connection parts of the subsidiary row lines may monotonically increase in the second direction.

These and/or other aspects will become apparent and more readily appreciated from the following description of the embodiments, the accompanying drawings, and claims.

These general and example aspects may be implemented by using a system, a method, a computer program, or a combination of a certain system, method, and computer program.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
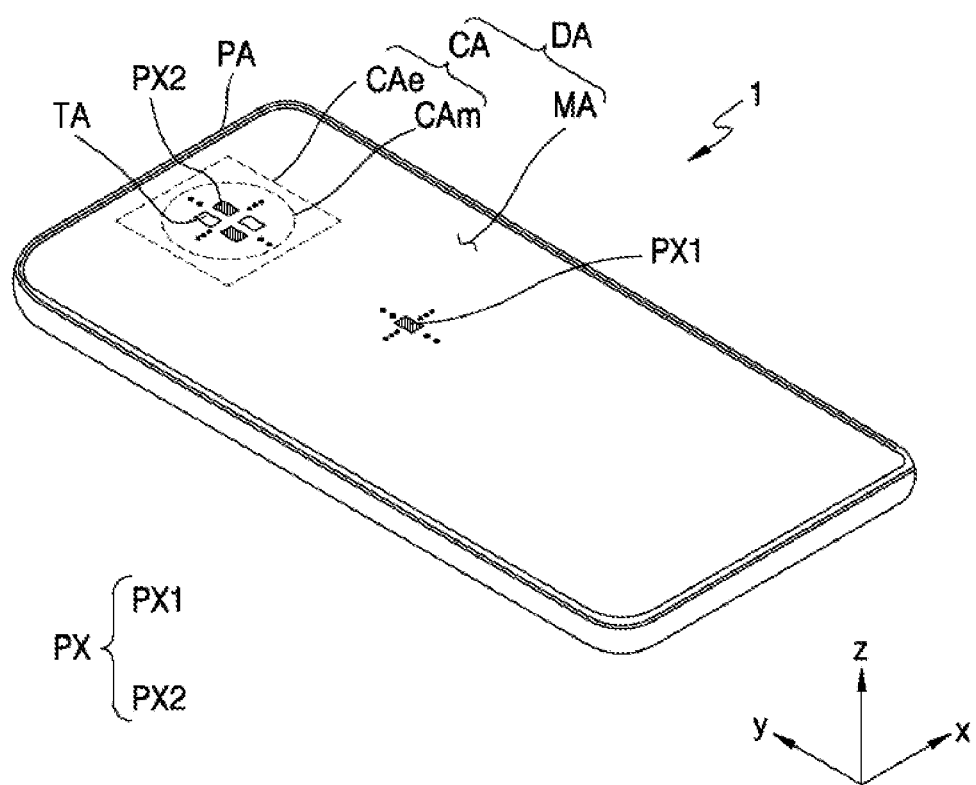
FIG. 1 is a perspective view of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to some embodiments.

Referring to FIG. 1, the display apparatus 1 may include a display area DA, and a peripheral area PA outside the display area DA. The display area DA may include a component area CA, and a main area MA that at least partially surrounds the component area CA. That is, the component area CA and the main area MA may be configured to display images individually or separately. The peripheral area PA may be a non-display area in which display elements are not arranged. The display area DA may be entirely surrounded by the peripheral area PA (e.g., in a plan view).

It is shown in FIG. 1 that one component area CA is arranged inside the main area MA. In one or more other embodiments, the display apparatus 1 may include two or more component areas CA, and the plurality of component areas CA may have different shapes and sizes. When seen from a direction approximately perpendicular to the upper surface of the display apparatus 1, the component area CA may have various shapes, such as a circular shape, an elliptical shape, a polygon including a quadrangle, a star shape, or a diamond shape. In addition, when seen from a direction approximately perpendicular to the upper surface of the display apparatus 1, although it is shown in FIG. 1 that the component area CA is arranged approximately in the center at or toward the upper side (a +y-direction) of the main area MA and has an approximately quadrangular shape, the component area CA may instead be arranged at or toward one side, for example, the upper right side or upper left side of the main area MA, which has a quadrangular shape.

The display apparatus 1 may display images by using a plurality of pixels PX arranged in the display area DA. The display apparatus 1 may be configured to display images by using a plurality of first pixels PX1 and a plurality of second pixels PX2, the plurality of first pixels PX1 being arranged in the main area MA, and the plurality of second pixels PX2 being arranged in the component area CA. The plurality of first pixels PX1 and the plurality of second pixels PX2 may each include a display element. For example, the plurality of first pixels PX1 and the plurality of second pixels PX2 may each include a display element, such as an organic light-emitting diode OLED. Each pixel PX may emit, for example, red, green, blue, or white light from an organic light-emitting diode OLED. Hereinafter, in the present specification, the pixels PX may denote sub-pixels that emit light of different colors. For example, each pixel may be one of, a red sub-pixel, a green sub-pixel, or a blue sub-pixel.

As described below with reference to FIG. 2, a component 20, which is an electronic element, may be arranged below a display panel to correspond to the component area CA. The component 20 may be a camera that uses infrared light or visible light and the like, and may include a photographing element. In some embodiments, the component 20 may be a solar battery, a flash, an illuminance sensor, a proximity sensor, or an iris sensor. In some embodiments, the component 20 may have a function of receiving sound. To reduce limitation of the function of the component 20, the component area CA may include a transmission area TA through which light and/or sound output (or emitted) from the component 20 to the outside, or from the outside toward the component 20, may pass. In a display panel and a display apparatus including the display panel according to the embodiments of the present disclosure, when light passes through the component area CA, a light transmittance may be about 10% or more, may be about 40% or more, may be about 25% or more, may be about 50% or more, may be about 85% or more, or may be about 90% or more.

The component area CA may include a central region CAm, and an edge region CAe surrounding the central region CAm (e.g., in a plan view). The central region CAm may be a region through which the component 20 arranged below the component area CA substantially receives light. For example, in the case where the component 20 is a camera, the central region CAm may correspond to a camera lens. The central region CAm may correspond to the inner portion of a range of an angle of view of the camera lens. The edge region CAe may correspond to the rest of the range (e.g., the outer portion of the range) of the angle of view of the camera lens.

Although it is shown in FIG. 1 that the central region CAm has a circular shape, the central region CAm may have various other shapes, such as an elliptical shape, a polygon including a quadrangle, a star shape, or a diamond shape.

A plurality of second pixels PX2 may be arranged in the component area CA. The plurality of second pixels PX2 may be configured to display an image (e.g., a preset image) by emitting light. In some embodiments, an image displayed in the component area CA may be an auxiliary image, and may have a lower resolution than a resolution of an image displayed in the main area MA. That is, because the component area CA includes the transmission area TA through which light and sound may pass, and because pixels are not arranged in the transmission area TA, the number of second pixels PX2 per unit area in the component area CA may be less than the number of first pixels PX1 per unit area in the main area MA.

Figure 2:
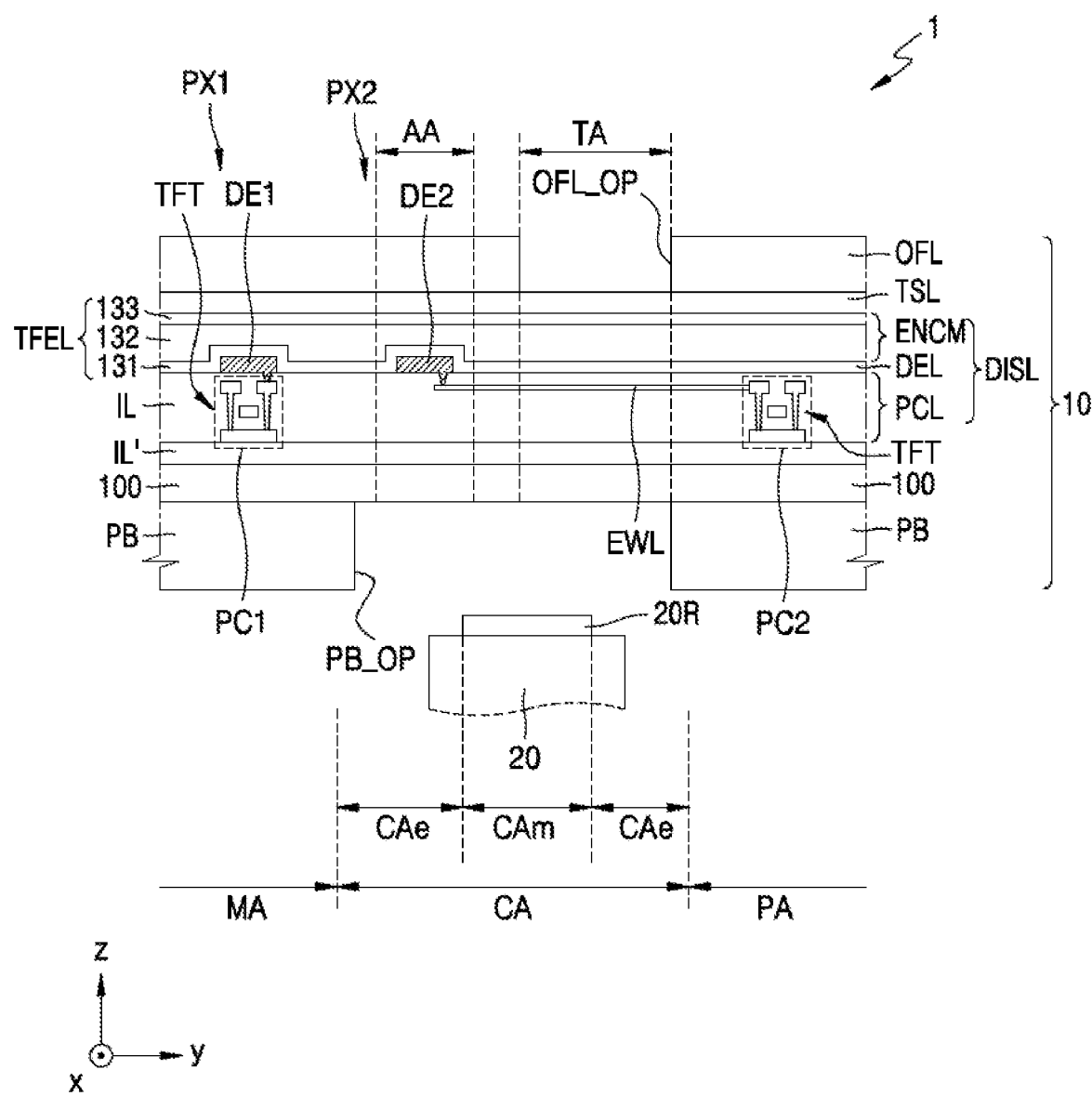
FIG. 2 is a cross-sectional view of a portion of the display apparatus according to some embodiments.

FIG. 2 is a cross-sectional view of a portion of the display apparatus 1 according to some embodiments.

Referring to FIG. 2, the display apparatus 1 may include a display panel 10, and the component 20 overlapping the display panel 10. In some embodiments, a cover window may be further arranged on the display panel 10, the cover window protecting the display panel 10.

The display panel 10 may include the component area CA and the main area MA, the component area CA being a region overlapping the component 20, and the main area MA displaying a main image. The display panel 10 may include a substrate 100, a display layer DISL, a touchscreen layer TSL, and an optical functional layer OFL on (e.g., above) the substrate 100, and a panel protection member PB under the substrate 100.

The display layer DISL may include a circuit layer PCL, a display element layer DEL, and an encapsulation member ENCM, the circuit layer PCL including a thin-film transistor TFT, the display element layer DEL including display elements DE1 and DE2, and the encapsulation member ENCM including a thin-film encapsulation layer TFEL or, in some embodiments, an encapsulation substrate. Insulating layer IL' may be arranged between the substrate 100 and the display layer DISL, and insulating layer IL may be arranged inside the display layer DISL.

The substrate 100 may include an insulating material such as glass, quartz, or a polymer resin. The substrate 100 may be a rigid substrate or a flexible substrate that is bendable, foldable, and/or rollable.

First pixels PX1 may be arranged in the main area MA of the display panel 10. The first pixel PX1 may include a first pixel circuit PC1, and a first display element DE1 connected to the first pixel circuit PC1. The first pixel circuit PC1 may include at least one thin-film transistor TFT, and may be configured to control light emission of the first display element DE1. The first pixel PX1 may be implemented by light emission of the first display element DE1.

The second pixels PX2 may be arranged in the component area CA of the display panel 10. The second pixel PX2 may include a second pixel circuit PC2, and a second display element DE2 connected to the second pixel circuit PC2. The second pixel circuit PC2 may include at least one thin-film transistor TFT, and may be configured to control light emission of the second display element DE2. The second pixel PX2 may be implemented by light emission of the second display element DE2.

In some embodiments, the second pixel circuit PC2 that drives the second display element DE2 may not be arranged in the component area CA, and may be arranged in the peripheral area PA, which is a non-display area. In one or more other embodiments, the second pixel circuit PC2 may be arranged in a portion of the main area MA, or may be arranged between the main area MA and the component area CA. However, various modifications may be made. That is, the second pixel circuit PC2 may not necessarily overlap the second display element DE2.

The second pixel circuit PC2 may be electrically connected to the second display element DE2 by an electrode connection line EWL. The electrode connection line EWL may include a transparent conductive material.

A region of the component area CA in which the second display element DE2 is arranged may be denoted by an auxiliary area AA. In addition, a region of the component area CA in which the second display element DE2 is not arranged may be denoted by the transmission area TA. The transmission area TA may be a region through which light/a signal emitted from the component 20 arranged to correspond to the component area CA, or light/a signal incident to the component 20, passes. The auxiliary area AA and the transmission area TA may be alternatingly arranged in the component area CA. The electrode connection line EWL connecting the second pixel circuit PC2 to the second display element DE2 may be arranged in the transmission area TA. Because the electrode connection line EWL may include a transparent conductive material having a high transmittance, even when the electrode connection line EWL is arranged in the transmission area TA, a transmittance of the transmission area TA may be suitable. In other words, the transmittance of the transmission area TA is not substantially reduced because the conductive material may be a transparent conductive material that has high transmittance.

According to some embodiments of the present disclosure, because the second pixel circuit PC2 is not arranged in the component area CA, the area of the transmission area TA may be suitable, and thus, light transmittance may be improved even more.

The component area CA may include the central region CAm, and the edge region CAe surrounding the central region CAm. The central region CAm may be a region through which the component 20 arranged below the component area CA substantially receives light. For example, in the case where the component 20 is a camera, the central region CAm may correspond to a camera lens 20R. The central region CAm may correspond to the inner range of an angle of view of the camera lens 20R. The edge region CAe may correspond to the rest of the range (e.g., the outer range) of the angle of view of the camera lens 20R.

The display element layer DEL may be covered by the thin-film encapsulation layer TFEL or the encapsulation substrate. In some embodiments, the thin-film encapsulation layer TFEL may include at least one inorganic encapsulation layer and at least one organic encapsulation layer, as shown in FIG. 2. In some embodiments, the thin-film encapsulation layer TFEL may include a first inorganic encapsulation layer 131, a second inorganic encapsulation layer 133, and an organic encapsulation layer 132 therebetween.

The first inorganic encapsulation layer 131 and the second inorganic encapsulation layer 133 may each include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$), and may be formed by chemical vapor deposition (CVD) and the like. $ZnO_x$ may be ZnO or $ZnO_2$. The organic encapsulation layer 132 may include a polymer-based material. The polymer-based material may include a silicon-based material, an acryl-based resin, an epoxy-based resin, polyimide, or polyethylene.

The first inorganic encapsulation layer 131, the organic encapsulation layer 132, and the second inorganic encapsulation layer 133 may be formed as one body to cover the main area MA and the component area CA.

In the case where the display element layer DEL is sealed by the encapsulation substrate, the encapsulation substrate may be arranged to face the substrate 100 with the display element layer DEL therebetween. There may be a gap between the encapsulation substrate and the display element layer DEL. The encapsulation substrate may include glass. Sealant may be arranged between the substrate 100 and the encapsulation substrate, the sealant including frit. The sealant may be arranged in the peripheral area PA. The sealant arranged in the peripheral area PA may surround the display area DA, and may reduce or prevent moisture penetrating to the display area DA through the lateral surface thereof.

The touchscreen layer TSL may obtain coordinate information corresponding to an external input, for example, a touch event. The touchscreen layer TSL may include a touch electrode, and touch wirings connected to the touch electrode. The touchscreen layer TSL may sense an external input by using a self-capacitive method or a mutual capacitive method.

The touchscreen layer TSL may be formed on the thin-film encapsulation layer TFEL. Alternatively, in some embodiments, the touchscreen layer TSL may be separately formed on a touch substrate, and then may be coupled to the thin-film encapsulation layer TFEL through an adhesive layer such as an optically clear adhesive (OCA). In some embodiments, the touchscreen layer TSL may be directly formed on the thin-film encapsulation layer TFEL. Accordingly, the adhesive layer may not be arranged between the touchscreen layer TSL and the thin-film encapsulation layer TFEL in some embodiments.

The optical functional layer OFL may include an anti-reflection layer. The anti-reflection layer may reduce reflectivity of light (e.g., external light) incident toward the display apparatus 1 from the outside.

In some embodiments, the optical functional layer OFL may be a polarizing film. The optical functional layer OFL may include an opening OFL_OP corresponding to the transmission area TA. Accordingly, a light transmittance of the transmission area TA may be remarkably improved. A transparent material such as an optically clear resin (OCR) may fill the opening OFL_OP of the optical functional layer OFL.

In some embodiments, the optical functional layer OFL may include a filter plate including a black matrix and color filters.

A panel protection member PB may be attached to the backside of the substrate 100 to support and to protect the substrate 100. The panel protection member PB may include an opening PB_OP corresponding to the component area CA. Because the panel protection member PB includes the opening PB_OP, a light transmittance of the component area CA may be improved. The panel protection member PB may include polyethylene terephthalate (PET) or polyimide (PI).

The area of the component area CA may be greater than an area in which the component 20 is arranged. Accordingly, the area of the opening PB_OP of the panel protection member PB may not necessarily coincide with the area of the component area CA.

In addition, a plurality of components 20 may be arranged in the component area CA. The plurality of components 20 may have different functions. For example, the plurality of components 20 may include at least two from among a camera (e.g., a photographing element), a solar battery, a flash, a proximity sensor, an illuminance sensor, or an iris sensor.

Figure 3:
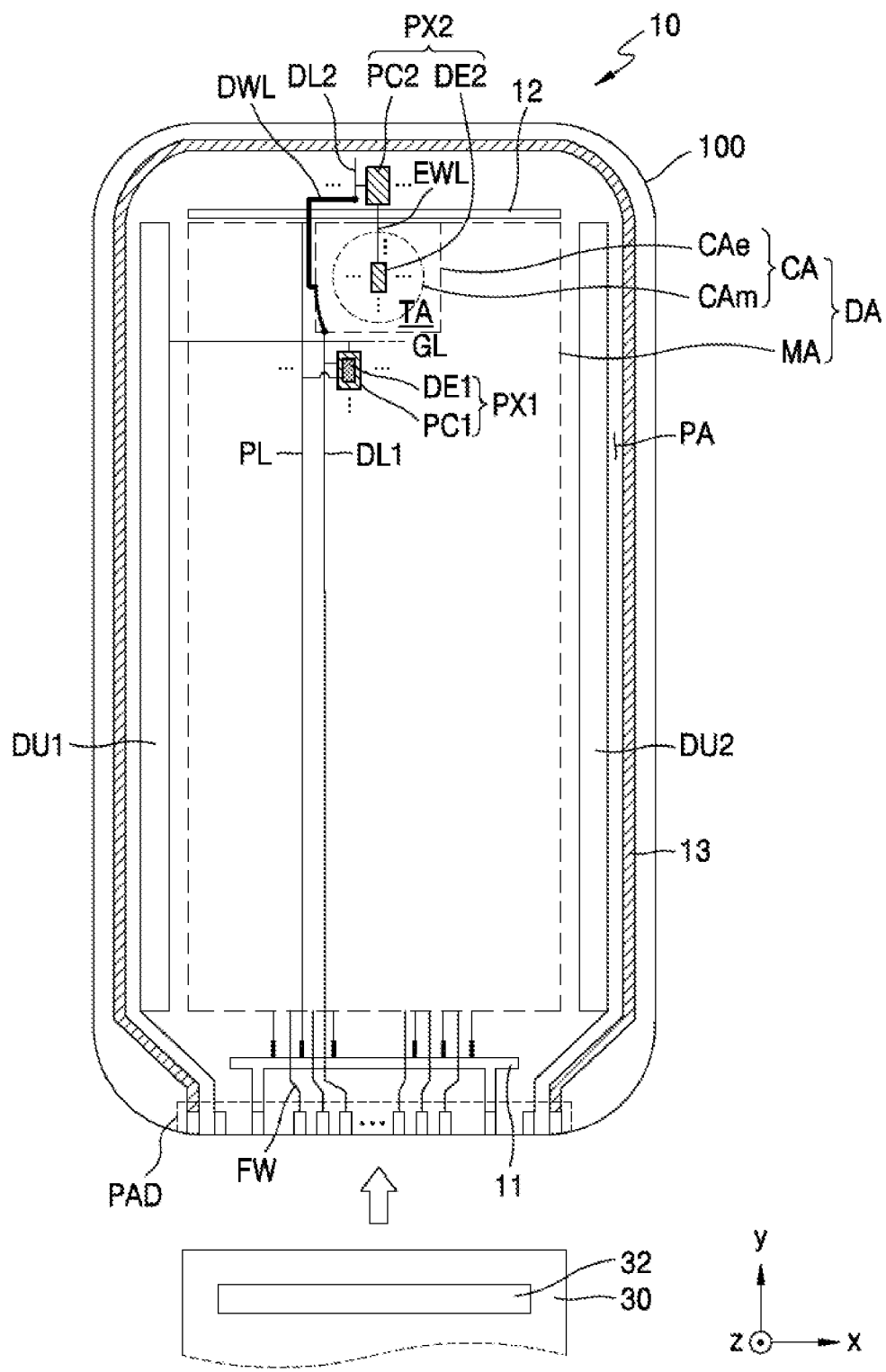
FIG. 3 is a plan view of a display panel that may be included in the display apparatus according to some embodiments.

FIG. 3 is a plan view of the display panel 10 that may be included in the display apparatus 1 according to some embodiments.

Referring to FIG. 3, various elements constituting the display panel 10 may be arranged over the substrate 100. The substrate 100 may include the display area DA, and the peripheral area PA surrounding the display area DA.

The display area DA may include the main area MA and the component area CA, the main area MA being configured to display a main image, and the component area CA including the transmission area TA and being configured to display an auxiliary image. The component area CA may be arranged on one side of the main area MA, or may be arranged inside the display area DA and surrounded by the main area MA. An auxiliary image may constitute one entire image in cooperation with a main image, or may be an image independent from the main image.

A plurality of first pixels PX1, each including the first pixel circuit PC1 and the first display element DE1, are arranged in the main area MA. The first pixel circuit PC1 and the first display element DE1 may be arranged in the main area MA, and may partially overlap each other. Each first pixel PX1 may emit, for example, red, green, blue, or white light.

The second pixel circuit PC2 of each of the plurality of second pixels PX2 may be arranged in the peripheral area PA, and the second display element DE2 of each of the plurality of second pixels PX2 may be arranged in the component area CA. In one or more embodiments, the second pixel circuit PC2 may not overlap the second display element DE2. The second pixel circuit PC2 may be connected to the second display element DE2 by the electrode connection line EWL. Each second pixel PX2 may emit, for example, red, green, blue, or white light.

In some embodiments, an emission area of the second display element DE2 may be greater than an emission area of the first display element DE1.

The transmission area TA of the component area CA may surround the plurality of second display elements DE2. Alternatively, in some embodiments, the transmission areas TA of the component area CA may be arranged in a lattice configuration with the plurality of second display elements DE2.

Because the component area CA has the transmission area TA, the resolution of the component area CA may be less than the resolution of the main area MA. In other words, the number of first display elements DE1 per unit area may be greater than the number of second display elements DE2 per unit area. For example, the resolution of the component area CA may be about ½, about ⅜, about ⅓, about ¼, about 2/9, about ⅛, about ⅑, about 1/12.25, or about 1/16 of the resolution of the main area MA. For example, the resolution of the main area MA may be about 400 ppi or more and the resolution of the component area CA may be about 200 ppi or more or about 100 ppi or more.

Each of the pixel circuits driving the pixels may be electrically connected to outer circuits arranged in the peripheral area PA. A first driver DU1, a second driver DU2, a pad portion PAD, a first driving voltage supply line 11, a second driving voltage supply line 12, and a common voltage supply line 13 may be arranged in the peripheral area PA.

The first driver DU1 may include a plurality of gate driving circuits. The gate driving circuit may be connected to a gate line GL extending in a first direction (e.g., a ±x-direction). The gate line GL may be connected to the first pixel circuits PC1 arranged on the same row. Electric signals may be sequentially transferred to the first pixel circuit PC1 through the gate line GL.

Although FIG. 3 shows the gate line GL as one wiring, the gate line GL may include a plurality of wirings. For example, the gate line GL may include a scan line, an emission control line, and the like.

A plurality of gate driving circuits may each include a scan driving circuit and an emission control driving circuit. The scan driving circuit of the gate driving circuit may be configured to provide a scan signal to the first pixel circuit PC1 through the scan line. In addition, the emission control driving circuit of the gate driving circuit may be configured to provide an emission control signal to the first pixel circuit PC1 through the emission control line.

The second driver DU2 may be arranged in parallel with the first driver DU1 with the display area DA therebetween. The pixels PX arranged in the display area DA may be connected to the first driver DU1 and the second driver DU2 in common. In one or more other embodiments, some of the pixels PX in the display area DA may be electrically connected to the first driver DU1, and the rest may be connected to the second driver DU2. In one or more other embodiments, the second driver DU2 may be omitted.

The pad portion PAD may be arranged on one side of the substrate 100. The pad portion PAD may be exposed and connected to a display circuit board 30 by not being covered by an insulating layer. A display driver 32 may be arranged on the display circuit board 30.

The display driver 32 may generate control signals transferred to the first driver DU1 and the second driver DU2. The display driver 32 generates a data signal. The generated data signal may be transferred to the first pixel circuit PC1 through a fan-out wiring FW and a first data line DL1, the first data line DL1 being connected to the fan-out wiring FW. The first data line DL1 may extend in a second direction (e.g., a ±y-direction), and may be connected to the first pixel circuit PC1 arranged on the same column.

In addition, the generated data signal may be transferred to the second pixel circuits PC2 through a second data line DL2 connected to the first data line DL1. The second data line DL2 may be connected to the first data line DL1 through a data connection line DWL.

In some embodiments, the data connection line DWL may at least partially overlap the component area CA. In other words, at least a portion of the data connection line DWL may overlap the component area CA. At least a portion of the data connection line DWL may overlap the edge region CAe of the component area CA. Because at least a portion of the data connection line DWL may overlap the edge region CAe, through which the component arranged below the display panel 10 does not substantially receive light, the function of the component may not be limited. In other words, the function of the component may not be substantially affected because the data connection line DWL only overlaps the edge region CAe, which is a portion of the component area CA that does not substantially block the component from receiving the light.

The display driver 32 may be configured to supply a driving voltage ELVDD (see FIG. 8) to a first driving voltage supply line 11 and/or a second driving voltage supply line 12, and may be configured to supply a common voltage ELVSS (see FIG. 8) to a common voltage supply line 13. The driving voltage ELVDD may be applied to the pixel circuits of the pixels through a driving voltage line PL connected to the first driving voltage supply line 11 and/or the second driving voltage supply line 12. The common voltage ELVSS may be connected to the common voltage supply line 13, and may be applied to an electrode of the display elements that is opposite to an electrode to which the driving voltage ELVDD is connected.

The first driving voltage supply line 11 and/or the second driving voltage supply line 12 may extend in parallel to each other in the first direction (e.g., the ±x-direction) with the display area DA therebetween. The common voltage supply line 13 may have a loop shape having one open side, and may partially surround the display area DA.

Figure 4:
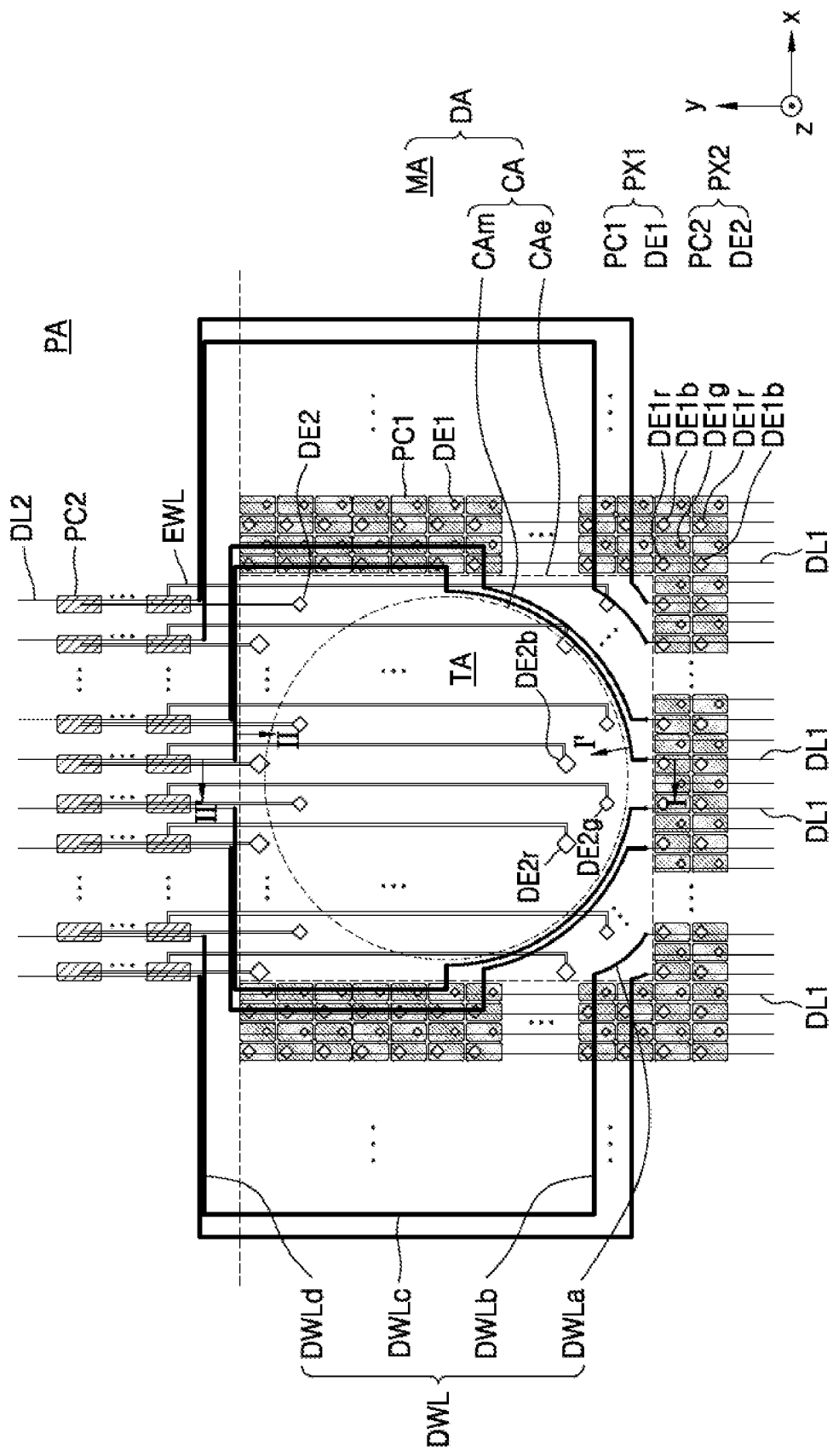
FIG. 4 is an enlarged plan view of a display panel according to some embodiments.

FIG. 4 is an enlarged plan view of a display panel according to one or more embodiments. For example, FIG. 4 shows a portion of the component area CA, the main area MA therearound, and the peripheral area PA.

Referring to FIG. 4, the plurality of first pixels PX1 each including the first pixel circuit PC1 and the first display element DE1 may be arranged in the main area MA. The first pixel circuits PC1 may overlap the first display elements DE1 in the main area MA.

The plurality of first pixel circuits PC1 may be arranged in a matrix configuration in the first direction (e.g., the ±x-direction) and the second direction (e.g., the ±y-direction).

The plurality of first display elements DE1 may each emit red, green, or blue light. Among the plurality of first display elements DE1, the first display element DE1 emitting red light may be denoted by a first red display element DE1r, the first display element DE1 emitting green light may be denoted by a first green display element DE1g, and the first display element DE1 emitting blue light may be denoted by a first blue display element DE1b.

In one or more embodiments, the plurality of first pixels PX1 may be arranged in an RGBG matrix structure (e.g., in a PENTILE™ scheme). PENTILE™ is a registered trademark of Samsung Display Co., Ltd., Republic of Korea. In other words, the plurality of first display elements DE1 may be arranged in an RGBG matrix structure (e.g., in a PENTILE™ scheme). For example, red display elements DE1r are respectively arranged on first and third vertexes among the vertexes of a virtual quadrangle with a first green display element DE1g centered at the center of the quadrangle, and first blue display elements DE1b are respectively arranged on second and fourth vertexes, which are the rest of the vertexes. An emission area of the first green display element DE1g may be less than an emission area of the first red display element DE1r and may be less than an emission area of the first blue display element DE1b.

This pixel arrangement structure is referred to as an RGBG matrix structure (.g., in a PENTILE™ scheme). PENTILE™ is a registered trademark Samsung Display Co., Ltd., Republic of Korea. By applying rendering, in which a color of a pixel is represented by sharing the colors of its adjacent pixels, a relatively high resolution may be obtained via a small number of pixels.

Although it is shown in FIG. 4 that the plurality of first pixels PX1 are arranged in an RGBG matrix structure (e.g., in a PENTILE™ scheme), the plurality of first pixels PX1 may be arranged in various configurations such as a stripe structure, a mosaic arrangement structure, and a delta arrangement structure in one or more other embodiments.

The plurality of second display elements DE2 may be arranged in the component area CA. A region of the component area CA in which the second display elements DE2 are not arranged may be defined as (or denoted by) the transmission area TA having a relatively high light transmittance. A region of the component area CA that does not overlap the second display element DE2 may be defined as (or denoted by) the transmission area TA having a relatively high light transmittance.

The plurality of second display elements DE2 may each emit red, green, or blue light. Among the plurality of second display elements DE2, the second display elements DE2 emitting red light may be denoted by second red display elements DE2r, the second display elements DE2 emitting green light may be denoted by second green display elements DE2g, and the second display elements DE2 emitting blue light may be denoted by second blue display elements DE2b.

The plurality of second display elements DE2 may be arranged in various shapes. Some of the plurality of second display elements DE2 may be gathered to form a group, and may be arranged in various configurations such as an RGBG matrix structure (e.g., in a PENTILE™ scheme), a stripe structure, a mosaic arrangement structure, a delta arrangement structure and the like inside the group. PENTILE™ is a registered trademark of Samsung Display Co., Ltd., Republic of Korea. Accordingly, a distance between the second display elements DE2 arranged inside the group may be the same as a distance between the first display elements DE1.

Alternatively, as shown in FIG. 4, the second display elements DE2 may be dispersed inside the component area CA. A distance between adjacent ones of the second display elements DE2 may be greater than a distance between adjacent ones of the first display elements DE1. For example, a distance between the second red display element DE2r and the second green display element DE2g adjacent thereto may be greater than a distance between the first red display element DE1r and the first green display element DE1g adjacent thereto. A distance between the second green display element DE2g and the second blue display element DE2b adjacent thereto may be greater than a distance between the first green display element DE1g and the first blue display element DE1b adjacent thereto. A distance between the second red display element DE2r and the second blue display element DE2b adjacent thereto may be greater than a distance between the first red display element DE1r and the first blue display element DE1b adjacent thereto.

In some embodiments, the number of first display elements DE1 per unit area may be greater than the number of second display elements DE2 per unit area. For example, the number of second display elements DE2 per unit area and the number of first display elements DE1 per unit area may be provided at ratios of about 1:2, about 1:4, about 1:8, about 1:9, and the like. In other words, the resolution of the component area CA may be about about ½, about ¼, about ⅛, about ⅑, and the like of the resolution of the main area MA.

In some embodiments, an emission area of the second display element DE2 may be greater than an emission area of the first display element DE1. For example, an emission area of the second red display element DE2r may be greater than an emission area of the first red display element DE1r. An emission area of the second green display element DE2g may be greater than an emission area of the first green display element DE1g. An emission area of the second blue display element DE2b may be greater than an emission area of the first blue display element DE1b. A difference between an emission area of the first display element DE1 and an emission area of the second display element DE2 may be determined based on a difference between brightness and/or resolutions of the main area MA and the component area CA.

The plurality of second pixel circuits PC2 implementing light emission of the plurality of second display elements DE2 may be arranged in the peripheral area PA. Because the second pixel circuits PC2 are not arranged in the component area CA, the component area CA may secure or provide for a wider transmission area TA.

The second pixel circuits PC2 may be respectively connected to the second display elements DE2 through the electrode connection lines EWL. When the electrode connection line EWL is connected to the second display element DE2, it may mean that the electrode connection line EWL is electrically connected to a pixel electrode of the second display element DE2.

Because a resistive-capacitive (RC) delay may result when the electrode connection line EWL is lengthened, the second pixel circuits PC2 may be arranged in consideration of the length of the electrode connection line EWL.

In some embodiments, the second pixel circuits PC2 may be arranged on an extension line connecting the second display elements DE2 arranged in the second direction (e.g., the ±y-direction). In addition, the second pixel circuits PC2 may be arranged in the second direction (e.g., the ±y-direction) according to the number of second display elements DE2 arranged in the second direction (e.g., the ±y-direction).

Although it is shown in FIG. 4 that the second pixel circuits PC2 are arranged in the second direction (e.g., the ±y-direction), the second pixel circuits PC2 may be arranged in the first direction (e.g., the ±x-direction) in one or more other embodiments.

The electrode connection lines EWL may extend in the second direction (e.g., the ±y-direction) to respectively connect the second display elements DE2 to the second pixel circuits PC2. The electrode connection lines EWL may include a transparent conductive material. For example, the electrode connection lines EWL may include a transparent conductive oxide (TCO). The electrode connection lines EWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Although it is shown in FIG. 4 that the electrode connection line EWL is provided as one body over the peripheral area PA to the second display element DE2 in the component area CA, the electrode connection line EWL may include a first connection part and a second connection part including different respective materials in one or more other embodiments.

For example, the first connection part may be a part arranged in the peripheral area PA and connected to the second pixel circuit PC2. The first connection part may include a conductive material including molybdenum (Mo), aluminum (Al), copper (Cu), or titanium (Ti), and may have a single-layered structure or a multi-layered structure including the above materials.

The second connection part may be a part arranged in the component area CA and connected at the edge of the component area CA. The second connection part may include a transparent conductive material. For example, the electrode connection line EWL may include a transparent conductive oxide (TCO). The electrode connection line EWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The plurality of first data lines DL1 may be arranged in the main area MA, and the plurality of second data lines DL2 may be arranged in the peripheral area PA. The first data line DL1 may be connected to the first pixel circuit PC1, and the second data line DL2 may be connected to the second pixel circuit PC2. For example, the first data line DL1 may extend in the second direction (e.g., the ±y-direction), and may be connected to the first pixel circuits PC1 arranged on the same column among the plurality of first pixel circuits PC1. The second data line DL2 may extend in the second direction (e.g., the ±y-direction), and may be connected to the second pixel circuits PC2 arranged on the same column among the plurality of second pixel circuits PC2.

The second data line DL2 may be connected to the first data line DL1 through the data connection line DWL. In other words, the data connection line DWL may connect the first data line DL1 to the second data line DL2. For example, as shown in FIG. 4, a corresponding second data line DL2 may be connected to a corresponding one of the first data lines DL1, which is disconnected or separated by the component area CA, through the data connection line DWL. The corresponding second data line DL2 may be connected to the corresponding first data line DL1, which extends in the second direction (e.g., the ±y-direction) from the second data line DL2, through the data connection line DWL. Accordingly, the same signal may be applied to the first pixel circuits PC1 and the second pixel circuits PC2 arranged on substantially the same column.

Although it is shown in FIG. 4 that the data connection line DWL is connected to the first data line DL1 in the component area CA, the data connection line DWL may also be connected to the first data line DL1 in the main area MA, or at a boundary between the main area MA and the component area CA, in one or more other embodiments.

Figure 5:
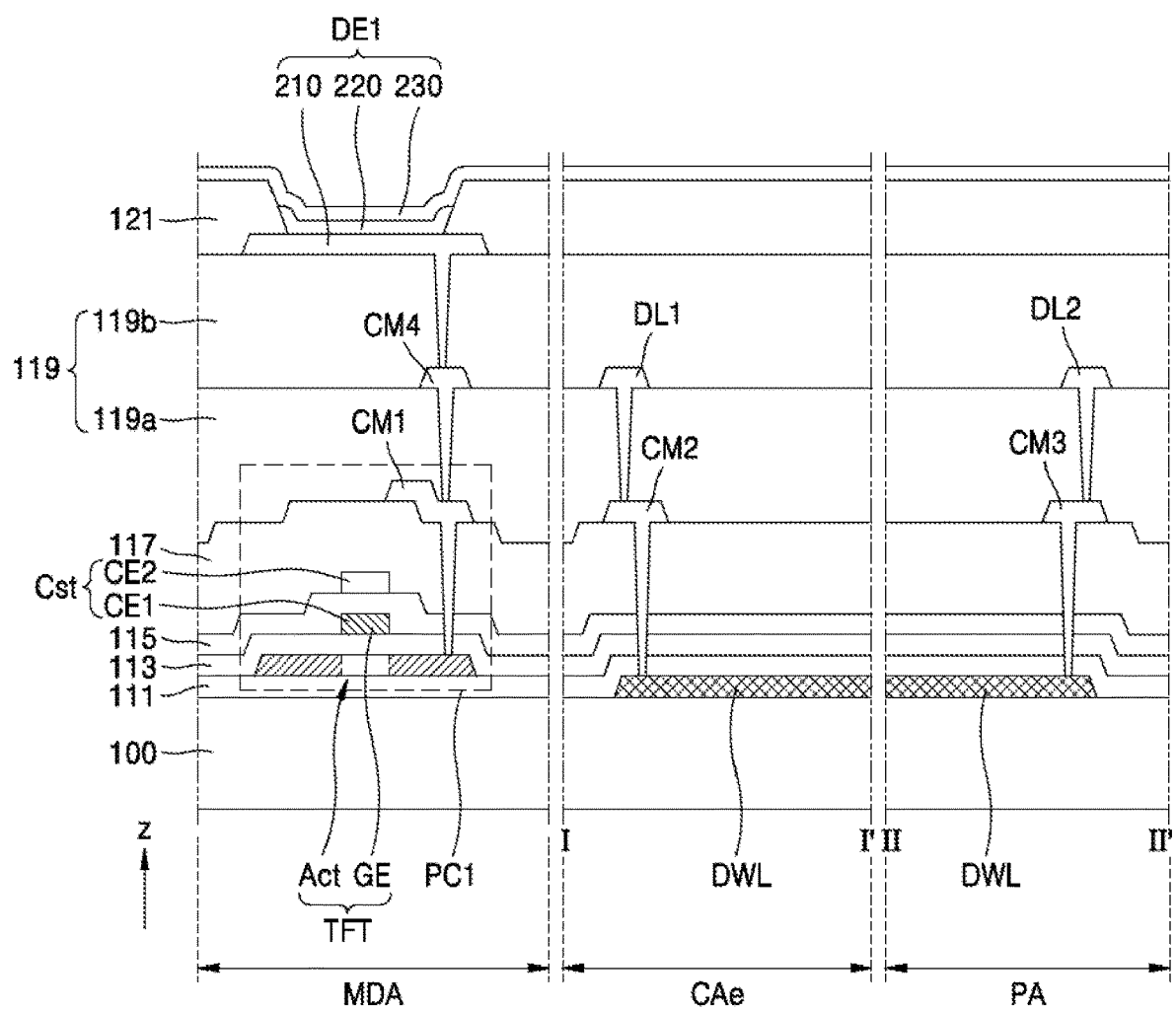
FIG. 5 is a cross-sectional view of a data connection line of FIG. 4, taken along the lines I-I' and II-II' according to some embodiments.

The data connection line DWL may be arranged on a layer that is different from the first data line DL1 and the second data line DL2, and may be connected to the first data line DL1 and the second data line DL2 through respective contact holes. For example, as shown in FIG. 5, the data connection line DWL may be arranged between the substrate 100 and a semiconductor layer Act, and the first data line DL1 and the second data line DL2 may be arranged over (e.g., at a layer above) the semiconductor layer Act.

In the case where the data connection line DWL is arranged between the substrate 100 and a semiconductor layer Act, because a probability that external light reaches the data connection line DWL is low (or the reflectivity of the data connection line DWL due to external light is low), the data connection line DWL may be arranged in only a portion of the display area DA, and thus, visibility thereof may be reduced or prevented.

As shown in FIG. 4, the data connection line DWL may have a shape that is bent at least one time. The data connection line DWL may include a plurality of parts respectively extending in the first direction (e.g., the ±x-direction) and the second direction (e.g., the ±y-direction). For example, the data connection line DWL may include a first part DWLa, a second part DWLb, a third part DWLc, and a fourth part DWLd, the first part DWLa overlapping the component area CA, the second part DWLb extending in the first direction (e.g., the ±x-direction), the third part DWLc extending in the second direction (e.g., the ±y-direction), and the fourth part DWLd extending in the first direction (e.g., the ±x-direction).

Two opposite ends of the first part DWLa of the data connection line DWL may be respectively connected to the first data line DL1, and to the second part DWLb of the data connection line DWL. Two opposite ends of the second part DWLb of the data connection line DWL may be respectively connected to the first part DWLa, and to the third part DWLc of the data connection line DWL. Two opposite ends of the third part DWLc of the data connection line DWL may be respectively connected to the second part DWLb, and to the fourth part DWLd of the data connection line DWL. Two opposite ends of the fourth part DWLd of the data connection line DWL may be respectively connected to the third part DWLc of the data connection line DWL, and to the second data line DL2.

The first part DWLa of the data connection line DWL may overlap the component area CA. The first part DWLa of the data connection line DWL may overlap the edge region CAe of the component area CA. The first part DWLa of the data connection line DWL may be arranged to detour around (e.g., go around) the central region CAm of the component area CA. The first part DWLa of the data connection line DWL may be arranged along the shape (or correspond to the shape) of the central region CAm. For example, as shown in FIG. 4, in the case where the planar shape of the central region CAm is circular, the first part DWLa of the data connection line DWL may have a curved shape.

Because the first part DWLa of the data connection line DWL is arranged to detour the central region CAm through which the component below the display panel substantially receives light, the function of the component may not be limited. In addition, because the first part DWLa of the data connection line DWL overlaps the component area CA, an area in which the data connection line DWL overlaps the main area MA may be reduced. Because the area in which the data connection line DWL overlaps the main area MA is reduced, interference with elements inside the first pixel circuits PC1 in the main area MA due to the data connection line DWL may be reduced (e.g., prevented).

The second part DWLb and the third part DWLc of the data connection line DWL may overlap at least a portion of the main area MA. The fourth part DWLd of the data connection line DWL may overlap the peripheral area PA.

FIG. 5 is a cross-sectional view of a data connection line DWL of FIG. 4, taken along the lines I-I' and II-II'. FIG. 5 shows a cross-section of a portion of the main area MA.

Referring to FIG. 5, the first data line DL1 may be connected to the second data line DL2 through the data connection line DWL. The same signal may be applied to the first data line DL1 and the second data line DL2, which are connected to each other by the data connection line DWL.

The data connection line DWL may be arranged at a layer that is different from the first data line DL1 and the second data line DL2, and may be connected to the first data line DL1 and the second data line DL2 through contact holes formed in insulating layers. For example, the data connection line DWL may be arranged between (e.g., at a layer between) the substrate 100 and the semiconductor layer Act. The first data line DL1 and the second data line DL2 may be arranged over (e.g., at a layer above) the semiconductor layer Act.

In the case where the data connection line DWL is arranged between the substrate 100 and a semiconductor layer Act, because a probability of external light reaching the data connection line DWL is low (or the reflectivity of the data connection line DWL due to external light is low), the data connection line DWL that is arranged in only a portion of the display area DA may not be viewed.

Hereinafter, referring to FIG. 5, the configuration of the display panel is described in more detail according to a stack structure thereof, and a position relationship between the data connection line DWL, the first data line DL1, the second data line DL2 and the like is also described.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer that includes the polymer resin and an inorganic layer.

A buffer layer 111 may reduce or block the penetration of foreign substance, moisture, or external air from below the substrate 100 and may provide a flat surface on the substrate 100. The buffer layer 111 may include an inorganic material such as an oxide or a nitride, an organic material, or an organic/inorganic composite material, and may include a single-layered structure or a multi-layered structure including the inorganic material and the organic material.

In some embodiments, a barrier layer may be further included between the substrate 100 and the buffer layer 111. The barrier layer may prevent or reduce impurities from the substrate 100 and the like from penetrating into the semiconductor layer Act. The barrier layer may include an inorganic material such as an oxide or a nitride, an organic material, or an organic/inorganic composite material, and may include a single-layered structure or a multi-layered structure including the inorganic material and the organic material.

The data connection line DWL may be arranged between the substrate 100 and the buffer layer 111. The data connection line DWL may include at least one of molybdenum (Mo), aluminum (Al), copper (Cu), or titanium (Ti), and may have a single-layered structure or a multi-layered structure including the above materials. For example, the data connection line DWL may be a single Mo layer. The data connection line DWL may have a multi-layered structure of Ti/Al/Ti. In one or more other embodiments, the data connection line DWL may include a transparent conductive oxide (TCO).

In the case where the data connection line DWL includes Mo, because the reflectivity of the data connection line DWL by external light is low due to material characteristics, the data connection line DWL arranged in only a portion of the display area DA may not be viewed (e.g., may not be noticeable to a user).

The semiconductor layer Act may be arranged on the buffer layer 111. The semiconductor layer Act may include amorphous silicon or polycrystalline silicon. In other embodiments, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

The semiconductor layer Act may include a channel region, a source region, and a drain region, the source region and the drain region respectively being on two opposite sides of the channel region. The semiconductor layer Act may include a single layer or a multi-layer.

A first gate insulating layer 113 and a second gate insulating layer 115 may be stacked over the substrate 100 to cover the semiconductor layer Act. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be ZnO or $ZnO_2$.

A gate electrode GE may be arranged on the first gate insulating layer 113. The gate electrode GE may be arranged to overlap at least a portion of the semiconductor layer Act. The gate electrode GE may include at least one of) molybdenum (Mo), aluminum (Al), copper (Cu), or titanium (Ti), and may have a single-layered structure or a multi-layered structure including the above materials. For example, the gate electrode GE may be a single Mo layer.

A second electrode CE2 of a storage capacitor Cst may be arranged on the second gate insulating layer 115. The second electrode CE2 of the storage capacitor Cst may include at least one of molybdenum (Mo), aluminum (Al), copper (Cu), or titanium (Ti), and may have a single-layered structure or a multi-layered structure including the above materials. For example, the second electrode CE2 of the storage capacitor Cst may be a single Mo layer.

In some embodiments, the storage capacitor Cst may include a first electrode CE1 and the second electrode CE2. As shown in FIG. 5, the storage capacitor Cst may overlap a transistor TFT. For example, the gate electrode GE of the transistor TFT may serve as the first electrode CE1 of the storage capacitor Cst. In some embodiments, the storage capacitor Cst may not overlap the transistor TFT, and may separately exist (e.g., may exist separately from the gate electrode GE).

The second electrode CE2 of the storage capacitor Cst overlaps the first electrode CE1 with the second gate insulating layer 115 therebetween, and constitutes a capacitance in cooperation with the first electrode CE1. Accordingly, the second gate insulating layer 115 may serve as a dielectric layer of the storage capacitor Cst.

An interlayer insulating layer 117 may be arranged on the second gate insulating layer 115 to cover the second electrode CE2 of the storage capacitor Cst. The interlayer insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be ZnO or $ZnO_2$.

A first connection electrode CM1, a second connection electrode CM2, and a third connection electrode CM3 may be arranged on the interlayer insulating layer 117. The first connection electrode CM1, the second connection electrode CM2, and the third connection electrode CM3 may include a conductive material such as molybdenum (Mo), aluminum (Al), copper (Cu), or titanium (Ti), and may have a single-layered structure or a multi-layered structure including the above materials. For example, the first connection electrode CM1, the second connection electrode CM2, and the third connection electrode CM3 may each have a multi-layered structure.

The first connection electrode CM1 may be connected to the semiconductor layer Act through a contact hole formed in the first gate insulating layer 113, the second gate insulating layer 115, and the interlayer insulating layer 117. The second connection electrode CM2 may be connected to the data connection line DWL through a contact hole formed in the buffer layer 111, the first gate insulating layer 113, the second gate insulating layer 115, and the interlayer insulating layer 117. The third connection electrode CM3 may be connected to the data connection line DWL through a contact hole formed in the buffer layer 111, the first gate insulating layer 113, the second gate insulating layer 115, and the interlayer insulating layer 117.

In some embodiments, the first connection electrode CM1, the second connection electrode CM2, and the third connection electrode CM3 may be covered by an inorganic protection layer. The inorganic protection layer may include a single layer or a multi-layer including silicon nitride ($SiN_x$) and silicon oxide ($SiO_x$). The inorganic protection layer may be introduced to cover and protect some wirings arranged on the interlayer insulating layer 117.

A planarization layer 119 is arranged to cover the first connection electrode CM1, the second connection electrode CM2, and the third connection electrode CM3. The planarization layer 119 may include contact holes connecting the transistor TFT to a pixel electrode 210.

The planarization layer 119 may include a single layer or a multi-layer including an organic material and may provide a flat upper surface. The planarization layer 119 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The planarization layer 119 may include a first planarization layer 119a and a second planarization layer 119b. A fourth connection electrode CM4, the first data line DL1, and the second data line DL2 may be arranged on the first planarization layer 119a. The fourth connection electrode CM4, the first data line DL1, and the second data line DL2 may include a conductive material, such as molybdenum (Mo), aluminum (Al), copper (Cu), or titanium (Ti), and may have a single-layered structure or a multi-layered structure including the above materials. For example, the fourth connection electrode CM4, the first data line DL1, and the second data line DL2 may have a multi-layered structure of Ti/Al/Ti.

The fourth connection electrode CM4 may be connected to the first connection electrode CM1 through a contact hole formed in the first planarization layer 119a, and may be connected to the transistor TFT through the first connection electrode CM1. The first data line DL1 may be connected to the second connection electrode CM2 through a contact hole formed in the first planarization layer 119a, and may be connected to the data connection line DWL connected to the second connection electrode CM2. The second data line DL2 may be connected to the third connection electrode CM3 through a contact hole formed in the first planarization layer 119a, and may connected to the data connection line DWL connected to the third connection electrode CM3.

The first display element DE1 may be arranged on the planarization layer 119. The first display element DE1 may be an organic light-emitting diode OLED. The first display element DE1 may include the pixel electrode 210, an intermediate layer 220, and an opposite electrode 230, the intermediate layer 220 including an organic emission layer.

The first display element DE1 may be connected to the transistor TFT through a contact hole formed in the second planarization layer 119b and the fourth connection electrode CM4. As a result, the first display element DE1 may be electrically connected to the first pixel circuit PC1 including the transistor TFT.

The pixel electrode 210 may be a light transmissive or a semi-light transmissive electrode or a reflective electrode. In one or more embodiments, the pixel electrode 210 may include a reflective layer and a transparent or semi-transparent electrode layer on the reflective layer, the reflective layer including at least one of Ag, Mg, Al, Pt, Pd, Au, Ni, Nd, Ir, Cr, or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 may include ITO/Ag/ITO.

In the display area of the substrate 100, a pixel-defining layer 121 may be arranged on the planarization layer 119. The pixel-defining layer 121 may cover the edges of the pixel electrode 210, and may include or define an opening that exposes the central portion of the pixel electrode 210. An emission area of the first display element DE1 may be defined by the opening.

The pixel-defining layer 121 may reduce (e.g., prevent) a likelihood of arcing and the like from occurring at the edges of the pixel electrode 210 by increasing a distance between the edges of the pixel electrode 210 and the opposite electrode 230 over the pixel electrode 210.

The pixel-defining layer 121 may include at least one organic insulating material from among polyimide, polyamide, an acrylic resin, benzocyclobutene, or a phenolic resin, and may be formed by spin coating and the like.

The intermediate layer 220 may be arranged inside the opening formed in, or defined by, the pixel-defining layer 121, and may include an organic emission layer. The organic emission layer may include an organic material including a fluorescent or phosphorous material that emits red, green, blue, or white light. The organic emission layer may include a low molecular weight organic material or a polymer organic material. A functional layer may be selectively further arranged under and on the organic emission layer, the functional layer being a hole transport layer (HTL), a hole injection layer (HIL), an electron transport layer (ETL), or an electron injection layer (EIL).

The opposite electrode 230 may be a light transmissive electrode or a reflective electrode. In some embodiments, the opposite electrode 230 may be a transparent or semi-transparent electrode, and may include a metal thin film having a small work function and including Li, Ca, LiF/Ca, LiF/Al, Al, Ag, Mg, or a compound thereof. In addition, a transparent conductive oxide (TCO) such as ITO, IZO, ZnO, or $In_2O_3$ may be further arranged on the metal thin film. The opposite electrode 230 may be arranged over the display area and may be arranged on the intermediate layer 220 and the pixel-defining layer 121. The opposite electrode 230 may be formed as one body over a plurality of organic light-emitting diodes OLED to correspond to the plurality of pixel electrodes 210.

Because the organic light-emitting diodes OLED may be potentially damaged by moisture or oxygen and the like from the outside, an encapsulation layer may cover and protect the organic light-emitting diodes OLED. The encapsulation layer may cover the display area and extend to at least a portion of the peripheral area. The encapsulation layer may include a first inorganic encapsulation layer, an organic encapsulation layer, and a second inorganic encapsulation layer.

Figure 6:
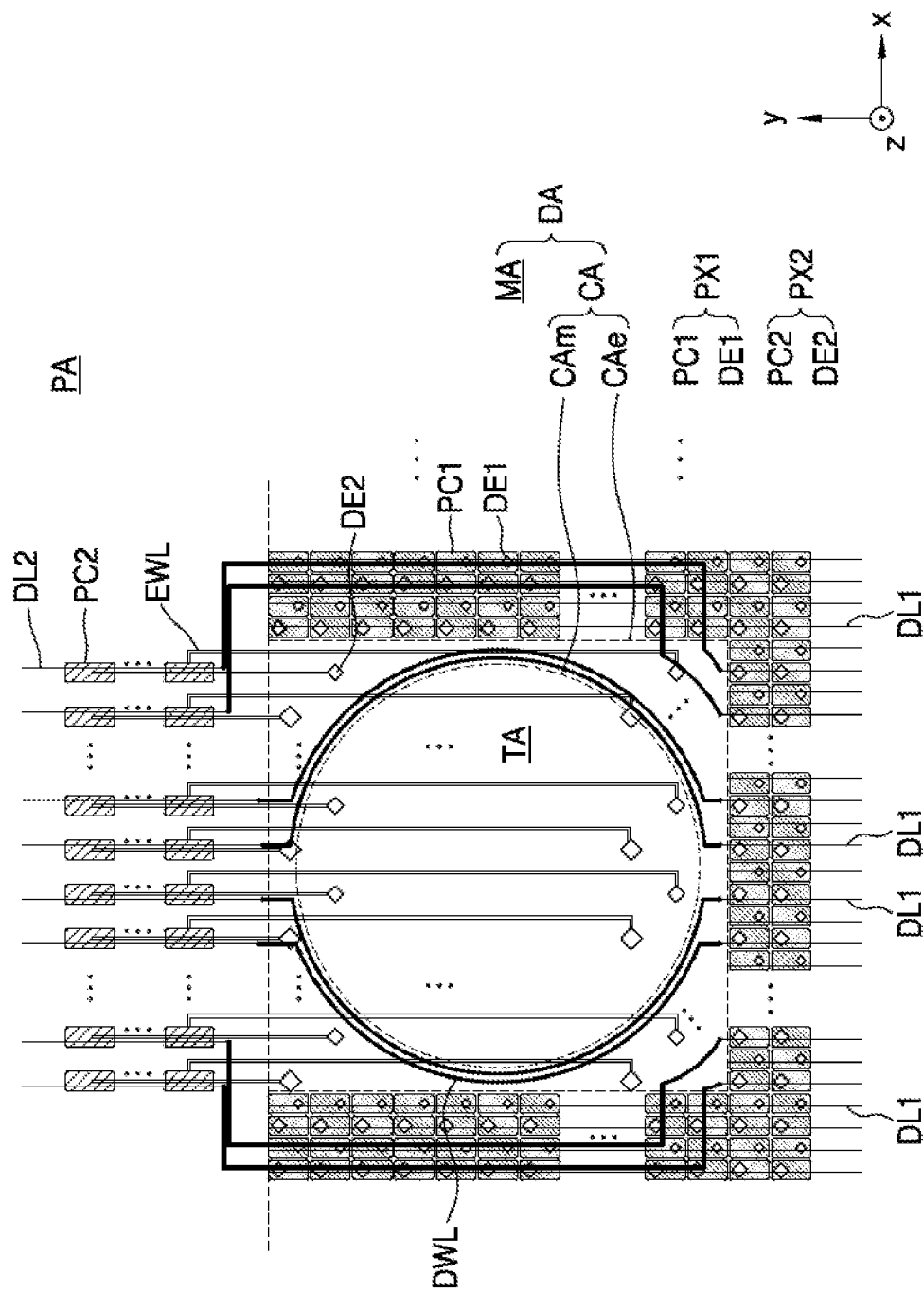
FIG. 6 is an enlarged plan view of a display panel according to some embodiments.

FIG. 6 is an enlarged plan view of a display panel according to some embodiments. FIG. 6 is a modified example of FIG. 4, and is different from FIG. 4 with respect to the structure of the data connection line. Hereinafter, contents already described with reference to FIG. 4 are omitted, and the differences are mainly described.

Referring to FIG. 6, at least one of the plurality of data connection lines DWL may be arranged in the component area CA. At least one of the plurality of data connection lines DWL may be arranged to detour or go around the central region CAm of the component area CA from the edge region CAe of the component area CA. In other words, at least one of the plurality of data connection lines DWL may not overlap the main area MA.

In the case where at least one of the plurality of data connection lines DWL is arranged in the component area CA, an area in which the data connection lines DWL overlap the main area MA may be reduced. An illuminance sensor and a proximity sensor and the like may be arranged below a region of the main area MA that does not overlap the data connection line DWL. Because the area in which the data connection lines DWL overlap the main area MA may be reduced, the illuminance sensor, the proximity sensor, and the like may be arranged closer to the component area CA.

Although it is shown in FIG. 6 that only some of the plurality of data connection lines DWL are arranged in the component area CA, in some embodiments, all of the data connection lines DWL may be arranged in the component area CA.

Figure 7:
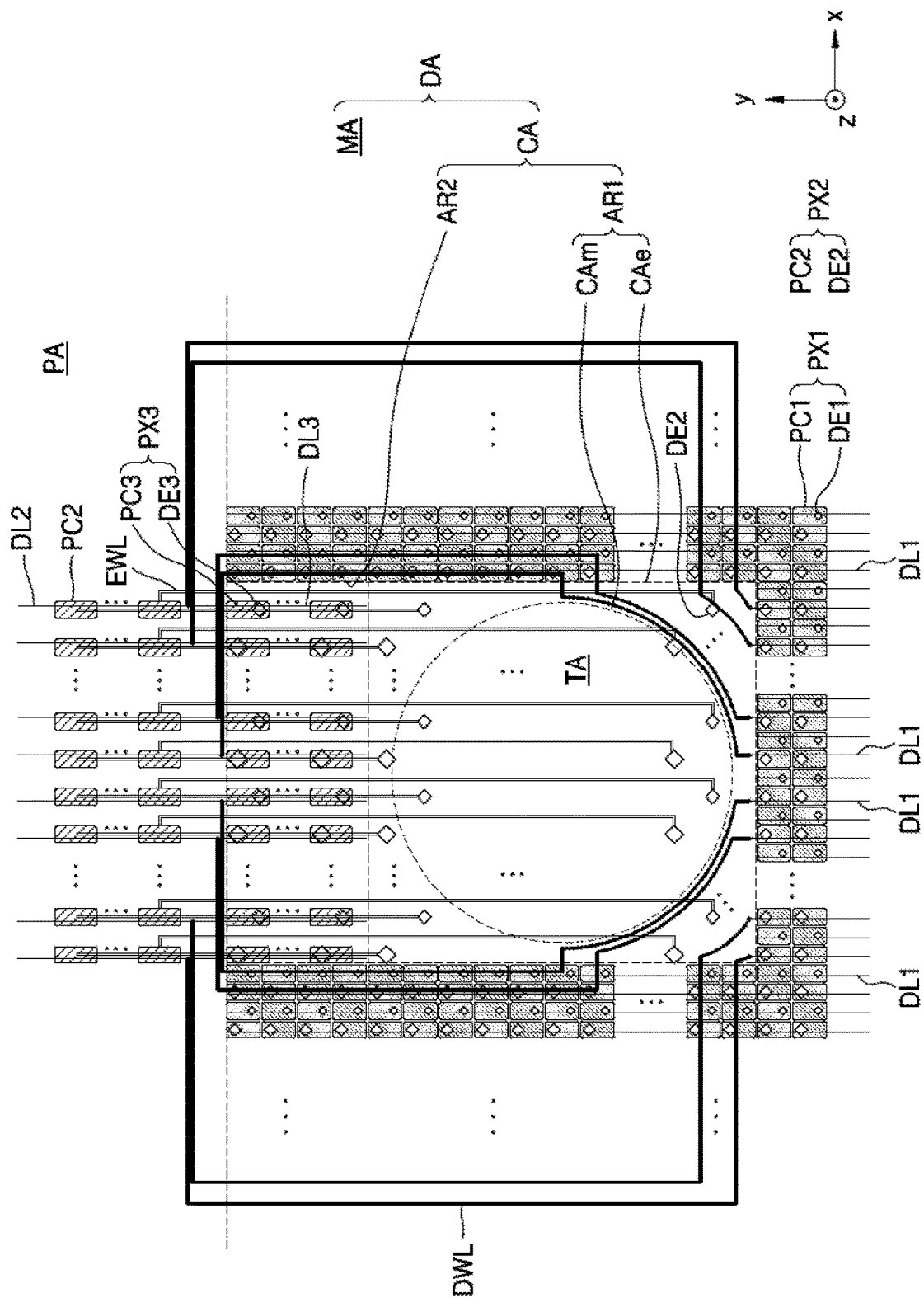
FIG. 7 is an enlarged plan view of the display panel of FIG. 6, according to some embodiments.

FIG. 7 is an enlarged plan view of a display panel according to some embodiments. FIG. 7 is a modified example of FIG. 4, and is different from FIG. 4 with respect to the structure of the component area CA. Hereinafter, contents already described with reference to FIG. 4 are omitted and the differences are mainly described.

Referring to FIG. 7, the component area CA may include a first region AR1 and a second region AR2. The first region AR1 may be adjacent to the second region AR2. For example, the first region AR1 may be adjacent to the second region AR2 in the second direction (e.g., the ±y-direction).

Although it is shown in FIG. 7 that the first region AR1 is adjacent to the second region AR2 in the second direction (e.g., the ±y-direction), the first region AR1 may be adjacent to the second region AR2 in the first direction (e.g., the ±x –direction) in one or more other embodiments.

The first region AR1 may correspond to the component area CA shown in FIG. 4. That is, the plurality of second display elements DE2 may be arranged in the first region AR1. A region of the first region AR1 in which the second display element DE2 is not arranged may be defined as (or denoted by) the transmission area TA having a high light transmittance. Alternatively, the central region CAm and the edge region CAe may be defined in the first region AR1 depending on whether the component arranged below the display panel substantially receives light.

A plurality of third pixels PX3 each including a third pixel circuit PC3 and a third display element DE3 may be arranged in the second region AR2. The third pixel circuits PC3 at least partially overlap the third display elements DE3 in the second region AR2.

The third pixel circuits PC3 may be arranged in the first direction (e.g., the ±x-direction) and the second direction (e.g., the ±y-direction). The third display elements DE3 may each emit red, green, or blue light. The third display elements DE3 may be arranged in various configurations. The configuration of the third display elements DE3 may be substantially the same as the configuration of the second display elements DE2.

For example, as shown in FIG. 7, the third display elements DE3 may be dispersed inside the second region AR2. A distance between adjacent ones of the third display elements DE3 may be greater than a distance between adjacent ones of the first display elements DE1. A distance between adjacent ones of the third display elements DE3 may be substantially the same as a distance between adjacent ones of the second display elements DE2.

In some embodiments, the number of first display elements DE1 per unit area may be greater than the number of third display elements DE3 per unit area. The number of third display elements DE3 per unit area and the number of first display elements DE1 per unit area may be provided at ratios of about about 1:2, about 1:4, about 1:8, about 1:9, and the like. In other words, the resolution of the second region AR2 may be about about ½, about ¼, about ⅛, about ⅑ and the like, of the resolution of the main area MA.

In some embodiments, the number of third display elements DE3 per unit area may be the same as the number of second display elements DE2 per unit area. In other words, the resolution of the second region AR2 may be the same as the resolution of the first area AR1.

In some embodiments, an emission area of the third display element DE3 may be greater than an emission area of the first display element DE1. A difference between the emission area of the first display element DE1 and the emission area of the third display element DE3 may be determined based on a difference in brightness and/or resolutions of the main area MA and the second region AR2. The emission area of the third display element DE3 may be the same as the emission area of the second display element DE2.

Although it is shown in FIG. 7 that the data connection lines DWL each overlap at least a portion of the component area CA, at least one of the plurality of data connection lines DWL may be arranged in the component area CA in one or more other embodiments as described in FIG. 6. At least one of the plurality of data connection lines DWL may detour the central region CAm of the component area CA in the edge region CAe of the component area CA, and may overlap at least a portion of the second region AR2. In other words, at least one of the plurality of data connection lines DWL may not overlap the main area MA.

Figure 8:
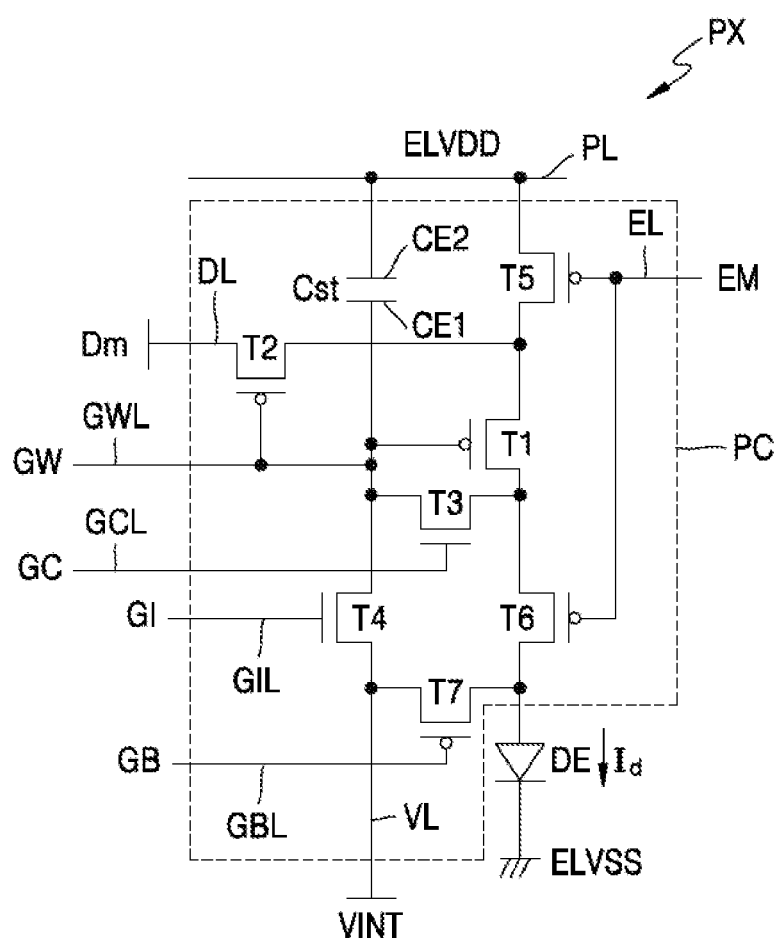
FIG. 8 is an equivalent circuit diagram of a pixel according to some embodiments.

FIG. 8 is an equivalent circuit diagram of a pixel PX according to some embodiments.

Referring to FIG. 8, the pixel PX is connected to first to fourth scan lines GWL, GCL, GIL, and GBL, a data line DL, and an emission control line EL, the first to fourth scan lines GWL, GCL, GIL, and GBL being respectively configured to transfer first to fourth scan signals GW, GC, GI, and GB, the data line DL being configured to transfer a data voltage Dm, and the emission control line EL being configured to transfer an emission control signal EM. The pixel PX is connected to the driving voltage line PL and an initialization voltage line VL, the driving voltage line PL being configured to transfer a driving voltage ELVDD, and the initialization voltage line VL being configured to transfer an initialization voltage VINT. The pixel PX is connected to a common electrode to which the common voltage ELVSS is applied. The pixel PX may correspond to a first pixel PX1 and/or a second pixel PX2 shown in FIG. 3.

Hereinafter, elements included in the pixel PX are described.

The pixel PX includes the display element DE, first to seventh transistors T1, T2, T3, T4, T5, T6, and T7, and the storage capacitor Cst. The display element DE may be an organic light-emitting diode including an anode and a cathode. The cathode may be a common electrode to which the common voltage ELVSS is applied. The first to seventh transistors T1, T2, T3, T4, T5, T6, and T7 may each include a thin-film transistor.

Some of the first to seventh transistors T1, T2, T3, T4, T5, T6, and T7 may be provided as n-channel metal oxide field-effect transistors (NMOSFET), and the rest may be provided as p-channel metal oxide field-effect transistors (PMOSFET). For example, the third transistor T3 and the fourth transistor T4 of the first to seventh transistors T1, T2, T3, T4, T5, T6, and T7 may be provided as NMOSFET (NMOS) and the rest may be provided as PMOSFET (PMOS).

In some embodiments, the third transistor T3, the fourth transistor T4, and the seventh transistor T7 of the first to seventh transistors T1, T2, T3, T4, T5, T6, and T7 may be provided as NMOS and the rest may be provided as PMOS. Alternatively, only one of the first to seventh transistors T1, T2, T3, T4, T5, T6, and T7 may be provided as an NMOS, and the rest may be provided as PMOS. Alternatively, all of the first to seventh transistors T1, T2, T3, T4, T5, T6, and T7 may be provided as NMOS.

The first transistor T1 may be a driving transistor in which the size of a drain current is determined according to a gate-source voltage, and the second to seventh transistors T2, T3, T4, T5, T6, and T7 may be switching transistors that are turned on/off according to a gate-source voltage, wherein the gate-source voltage is substantially a gate voltage.

The first transistor T1 may be denoted by a driving transistor, the second transistor T2 may be denoted by a scan transistor (e.g., a switching transistor), the third transistor T3 may be denoted by a compensation transistor, the fourth transistor T4 may be denoted by a gate initialization transistor, the fifth transistor T5 may be denoted by an operation control transistor, the sixth transistor T6 may be denoted by an emission control transistor, and the seventh transistor T7 may be denoted by an anode initialization transistor.

The storage capacitor Cst is connected between the driving voltage line PL and a gate of the driving transistor T1. The storage capacitor Cst may include the second electrode CE2 and the first electrode CE1, the second electrode CE2 being connected to the driving voltage line PL, and the first electrode CE1 being connected to the gate of the first transistor T1.

The driving transistor T1 may control the size of a driving current Id flowing to the display element DE from the driving voltage line PL according to a gate-source voltage thereof. The driving transistor T1 may include the gate, a source, and a drain, the gate being connected to the first electrode CE1 of the storage capacitor Cst, the source being connected to the driving voltage line PL through the operation control transistor T5, and the drain being connected to the display element DE through the emission control transistor T6.

The driving transistor T1 may output the driving current Id to the display element DE according to the gate-source voltage. The size of the driving current Id is determined based on a difference between the gate-source voltage of the driving transistor T1 and a threshold voltage. The display element DE may receive the driving current $I_d$ from the driving transistor T1 and may emit light at a brightness corresponding to the size of the driving current $I_d$.

The scan transistor T2 may be configured to transfer a data voltage Dm to the source of the driving transistor T1 according to a first scan signal GW. The scan transistor T2 may include a gate, a source, and a drain, the gate being connected to the first scan line GWL, the source being connected to the data line DL, and the drain being connected to the source of the driving transistor T1.

The compensation transistor T3 connects the drain of the driving transistor T1 to the gate of the driving transistor T1 according to a second scan signal GC. The compensation transistor T3 may include a gate, a source, and a drain, the gate being connected to the second scan line GCL, the source being connected to the gate of the driving transistor T1, and the drain being connected to the drain of the driving transistor T1.

The gate initialization transistor T4 applies the initialization voltage VINT to the gate of the driving transistor T1 according to a third scan signal GI. The gate initialization transistor T4 may include a gate, a source, and a drain, the gate being connected to the third scan line GIL, the source being connected to the initialization voltage line VL, and the drain being connected to the gate of the driving transistor T1.

The anode initialization transistor T7 applies the initialization voltage VINT to an anode of the display element DE according to a fourth scan signal GB. The anode initialization transistor T7 may include a gate, a source, and a drain, the gate being connected to the fourth scan line GBL, the source being connected to the anode of the display element DE, and the drain being connected to the initialization voltage line VL.

Although it is shown in FIG. 8 that the gate initialization transistor T4 and the anode initialization transistor T7 are connected to the same initialization voltage line VL, the gate initialization transistor T4 and the anode initialization transistor T7 may be respectively connected to different initialization voltage lines in one or more other embodiments.

The operation control transistor T5 may connect the driving voltage line PL to the source of the driving transistor T1 according to an emission control signal EM. The operation control transistor T5 may include a gate, a source, and a drain, the gate being connected to the emission control line EL, the source being connected to the driving voltage line PL, and the drain being connected to the source of the driving transistor T1.

The emission control transistor T6 may connect the drain of the driving transistor T1 to the anode of the display element DE according to an emission control signal EM. The emission control transistor T6 may include a gate, a source, and a drain, the gate being connected to the emission control line EL, the source being connected to the drain of the driving transistor T1, and the drain being connected to the anode of the display element DE.

A first scan signal GW may be substantially synchronized with a second scan signal GC. A third scan signal GI may be substantially synchronized with a first scan signal GW of the previous row. A fourth scan signal GB may be substantially synchronized with a first scan signal GW. In one or more other embodiments, a fourth scan signal GB may be substantially synchronized with a first scan signal GW of the next row.

Hereinafter, an example operation process of a pixel PX is described in detail according to one or more embodiments.

First, when a high emission control signal EM is received, the operation control transistor T5 and the emission control transistor T6 are turned off, the driving transistor T1 stops outputting the driving current Id, and the display element DE stops emitting light.

After that, during a gate initialization period in which a third scan signal GI is received, the gate initialization transistor T4 is turned on and the initialization voltage VINT is applied to the gate of the driving transistor T1, that is, the first electrode CE1 of the storage capacitor Cst. A difference ELVDD-VINT between the driving voltage ELVDD and the initialization voltage VINT is stored in the storage capacitor Cst.

After that, during a data write period in which a first scan signal GW of a low level and a second scan signal GC of a high level are received, the scan transistor T2 and the compensation transistor T3 are turned on, and the data voltage Dm is applied to the source of the driving transistor T1. The driving transistor T1 is diode-connected and forward-biased by the compensation transistor T3. A gate voltage of the driving transistor T1 rises or increases from the initialization voltage VINT. When the gate voltage of the driving transistor T1 becomes the same or substantially the same as a data compensation voltage Dm−|Vth| (which is the data voltage Dm reduced by the threshold voltage Vth of the driving transistor T1), the driving transistor T1 is turned off and the increasing gate voltage of the driving transistor T1 stops. Accordingly, a difference ELVDD−Dm+|Vth| between the driving voltage ELVDD and the data compensation voltage Dm−|Vth| is stored in the storage capacitor Cst.

In addition, during an anode initialization period in which a low level fourth scan signal GB is received, the anode initialization transistor T7 is turned on, and the initialization voltage VINT is applied to the anode of the display element DE. Because the initialization voltage VINT is applied to the anode of the display element DE to have the display element DE not emit light, the display element DE may be prevented from emitting light (e.g., light leakage may be reduced or prevented) in response to a black grayscale in the next frame.

A first scan signal GW may be substantially synchronized with a fourth scan signal GB. Accordingly, the data-write period may be the same as the anode initialization period.

After that, when a low level emission control signal EM is received, the operation control transistor T5 and the emission control transistor T6 are turned on, the driving transistor T1 outputs the driving current $I_d$, and the display element DE may emit light at a brightness corresponding to the size (e.g., magnitude) of the driving current $I_d$, the driving current $I_d$ corresponding to the voltage stored in the storage capacitor Cst (e.g., a voltage ELVDD-Dm obtained by subtracting the threshold voltage |Vth| of the driving transistor T1 from the source-gate voltage ELVDD−Dm+|Vth|).

In some embodiments, at least one of the first to seventh transistors T1, T2, T3, T4, T5, T6, and T7 includes a semiconductor layer including oxide, and the rest include a semiconductor layer including silicon.

In some embodiments, the driving transistor T1 that directly influences the brightness of the display apparatus may include a semiconductor layer including polycrystalline silicon having a relatively high reliability. Thus, a display apparatus implemented with this driving transistor T1 may achieve a relatively high resolution through this configuration.

Because an oxide semiconductor has a relatively high carrier mobility and a relatively low leakage current, a voltage drop thereof is relatively small (e.g., not large) even when a driving time is relatively long. That is, because a color change of an image according to a voltage drop is relatively small (e.g., not large) while the display apparatus is driven at relatively low frequencies, the display apparatus may be driven at relatively low frequencies.

Because an oxide semiconductor has a relatively low leakage current, at least one of the compensation transistor T3, the gate initialization transistor T4, or the anode initialization transistor T7 connected to the gate of the driving transistor T1 may employ an oxide semiconductor to reduce (e.g., prevent) a leakage current that may flow to the gate of the driving transistor T1 and concurrently reduce power consumption.

Figure 9:
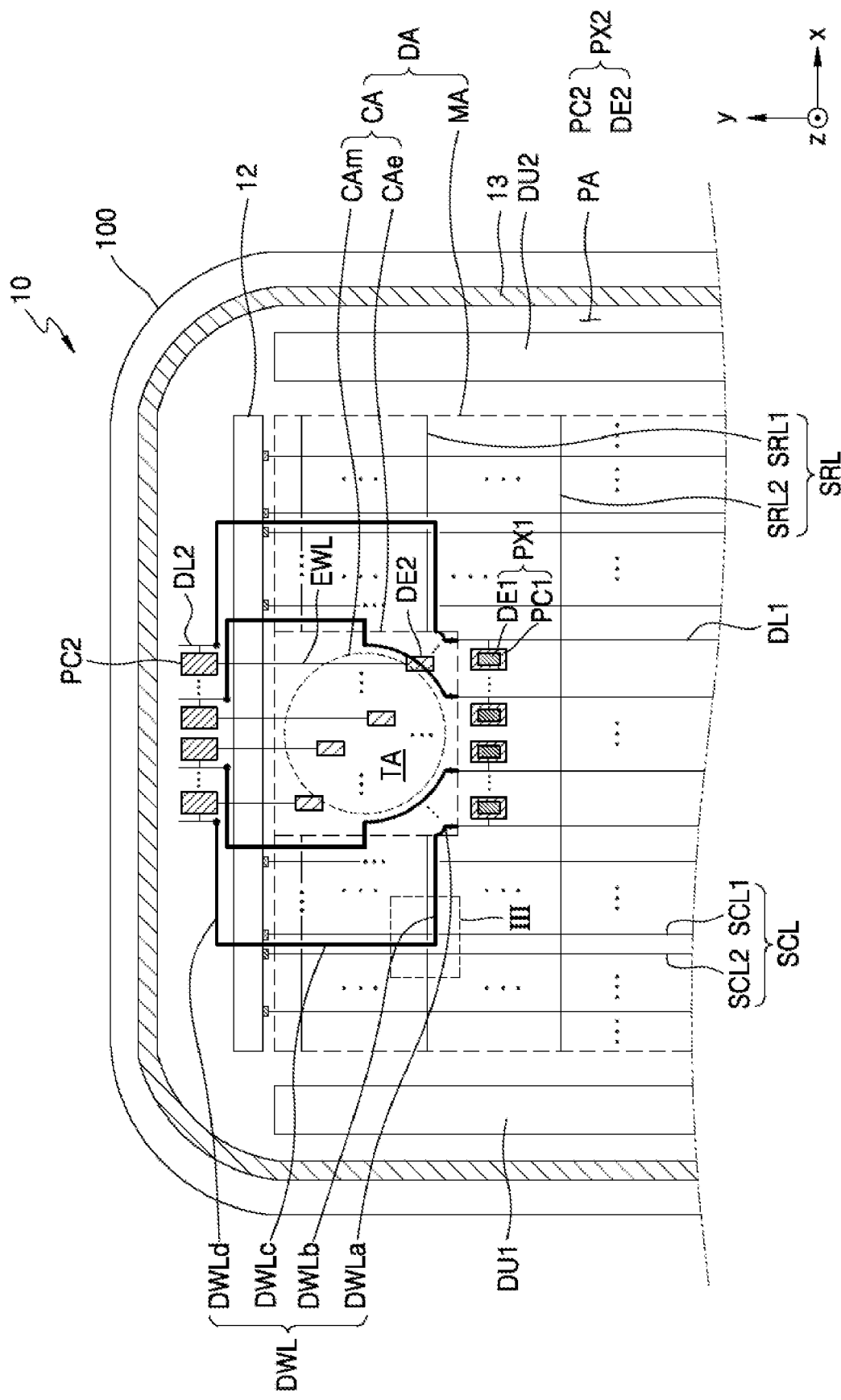
FIG. 9 is a plan view of a display panel that may be included in a display apparatus according to some embodiments.

FIG. 9 is a plan view of a display panel that may be included in a display apparatus according to some embodiments.

Referring to FIG. 9, the display panel 10 may include the plurality of first pixel circuits PC1, the plurality of first display elements DE1, the plurality of second display elements DE2, and the plurality of second pixel circuits PC2. The plurality of first pixel circuits PC1 and the plurality of first display elements DE1 may be arranged in the main area MA, the plurality of second display elements DE2 may be arranged in the component area CA, and the plurality of second pixel circuits PC2 may be arranged in the peripheral area PA. The first pixel circuits PC1 may overlap the first display elements DE1. Contrastingly, the second pixel circuits PC2 may not overlap the second display elements DE2.

As described with reference to FIG. 4, the first data line DL1 may be connected to the second data line DL2 through the data connection line DWL, the first data line DL1 being connected to the first pixel circuit PC1, and the second data line DL2 being connected to the second pixel circuit PC2. The data connection line DWL may include the first part DWLa, the second part DWLb, the third part DWLc, and the fourth part DWLd, the second part DWLb extending in the first direction (e.g., the ±x-direction), the third part DWLc extending in the second direction (e.g., the ±y-direction), and the fourth part DWLd extending in the first direction (e.g., the ±x-direction). The first part DWLa of the data connection line DWL may overlap the edge region CAe of the component area CA, the second part DWLb and the third part DWLc of the data connection line DWL may overlap at least a portion of the main area MA, and the fourth part DWLd of the data connection line DWL may overlap the peripheral area PA.

The display panel 10 may include a plurality of subsidiary row lines SRL and a plurality of subsidiary column lines SCL. Some of the plurality of subsidiary row lines SRL may be denoted by first subsidiary row lines SRL1, and others may be denoted by second subsidiary row lines SRL2. Some of the plurality of subsidiary column lines SCL may be denoted by first subsidiary column lines SCL1, and others may be denoted by second subsidiary column lines SCL2.

The first subsidiary row lines SRL1 may extend in the first direction (.g., the ±x-direction). Some of the first subsidiary row lines SRL1 may be arranged on the left of the component area CA, and others may be arranged on the right of the component area CA. In other words, the first subsidiary row lines SRL1 may be spaced physically apart from each other by the component area CA.

The driving voltage ELVDD (see FIG. 8) may be applied to the first subsidiary row lines SRL1. For example, the first subsidiary row lines SRL1 may be connected to the subsidiary column lines SCL that are connected to the second driving voltage supply line 12.

The first subsidiary row lines SRL1 may each include a plurality of row connection parts spaced apart from each other by the third parts DWLc of the data connection lines DWL.

In some embodiments, the number of row connection parts of each of the first subsidiary row lines SRL1 may monotonically increase in the +y-direction. In other words, when a distance by which the first subsidiary row line SRL1 is spaced apart in the +y-direction from the peripheral area PA becomes shorter, the number of row connection parts of the first subsidiary row line SRL1 may increase. This is described in more detail with reference to FIG. 10.

The second subsidiary row lines SRL2 may extend in the first direction (e.g. the ±x-direction). The driving voltage ELVDD may be applied to the second subsidiary row lines SRL2. For example, the second subsidiary row lines SRL2 may be connected to the subsidiary column lines SCL connected to the second driving voltage supply line 12.

The first subsidiary column lines SCL1 may extend in the second direction (e.g., the ±y-direction). The first subsidiary column lines SCL1 may each include a plurality of column connection parts spaced apart from each other by the second parts DWLb of the data connection lines DWL.

The driving voltage ELVDD may be applied to the first subsidiary column lines SCL1. At least one of the column connection parts of the first subsidiary column line SCL1 may be connected to the second driving voltage supply line 12. The first subsidiary column lines SCL1 may be connected to the subsidiary row lines SRL to which the driving voltage ELVDD is applied.

The second subsidiary column lines SCL2 may extend in the second direction (e.g., the ±y-direction). The driving voltage ELVDD may be applied to the second subsidiary column lines SCL2. For example, the second subsidiary column lines SCL2 may be connected to the second driving voltage supply line 12 to receive the driving voltage ELVDD.

In some embodiments, the subsidiary row lines SRL and the subsidiary column lines SCL may be arranged on the same layer. The subsidiary row lines SRL and the subsidiary column lines SCL, with the exception of the parts that are spaced apart from each other by the data connection line DWL, may be one body.

Figure 10:
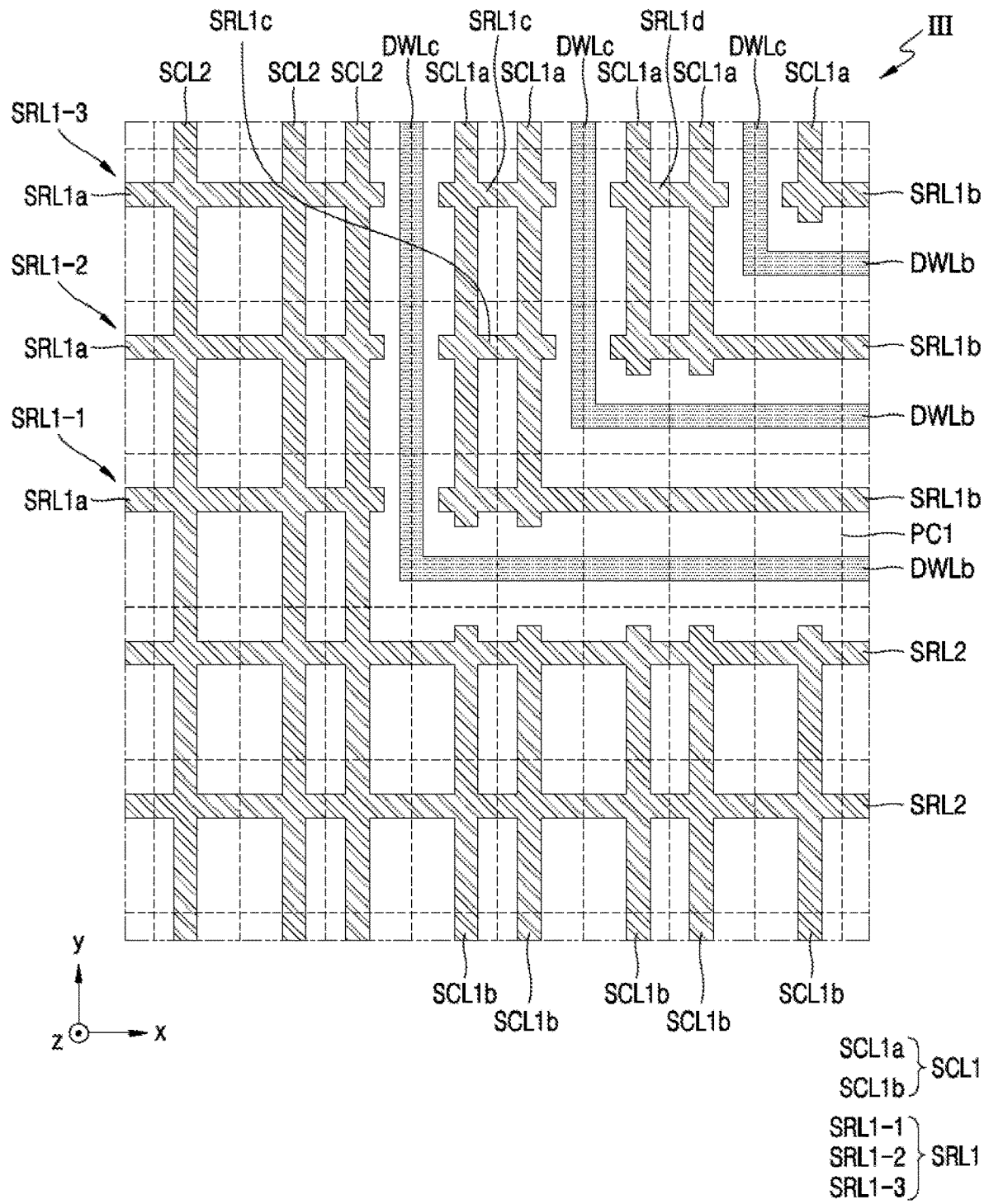
FIG. 10 is an enlarged plan view of a portion of FIG. 9 according to some embodiments.

FIG. 10 is an enlarged plan view of a portion of FIG. 9.

First, referring to FIG. 10, the first subsidiary row lines SRL1 may extend in the first direction (e.g., the ±x-direction). The first subsidiary row lines SRL1 may each include a plurality of row connection parts spaced apart from each other by the third parts DWLc of the data connection lines DWL.

In some embodiments, the number of row connection parts of each of the first subsidiary row lines SRL1 may monotonically increase in the +y-direction. In other words, the number of third parts DWLc of the data connection lines DWL crossing the first subsidiary row line SRL1 may monotonically increase in the +y-direction.

For example, a (1-1)st subsidiary row line SRL1-1, which is one of the first subsidiary row lines SRL1, may include a first row connection part SRL1a and a second row connection part SRL1b spaced apart from each other by the third part DWLc of the data connection line DWL.

A (1-2)nd subsidiary row line SRL1-2, which is another one of the first subsidiary row lines SRL1, may include a first row connection part SRL1a, a second row connection part SRL1b, and a third row connection part SRL1c spaced apart from each other by the third parts DWLc of the data connection lines DWL.

A (1-3)rd subsidiary row line SRL1-3, which is another one of the first subsidiary row lines SRL1, may include a first row connection part SRL1a, a second row connection part SRL1b, a third row connection part SRL1c, and a fourth row connection part SRL1d spaced apart from each other by the third parts DWLc of the data connection lines DWL.

The (1-1)st subsidiary row line SRL1-1 may include two row connection parts, the (1-2)nd subsidiary row line SRL1-2 may include three row connection parts, and the (1-3)rd subsidiary row line SRL1-3 may include four row connection parts. In other words, the (1-1)st subsidiary row line SRL1-1 may cross the third part DWLc of one data connection line DWL, the (1-2)nd subsidiary row line SRL1-2 may cross the third parts DWLc of two data connection lines DWL, and the (1-3)rd subsidiary row line SRL1-3 may cross the third parts DWLc of three data connection lines DWL. Accordingly, the (1-2)nd subsidiary row line SRL1-2 may be arranged in the +y-direction with respect to the (1-1)st subsidiary row line SRL1-1, and the (1-3)rd subsidiary row line SRL1-3 may be arranged in the +y-direction with respect to the (1-2)nd subsidiary row line SRL1-2.

Some of the row connection parts of the first subsidiary row line SRL1 may be connected to the first subsidiary column line SCL1, and others may be connected to the second subsidiary column line SCL2. For example, as shown in FIG. 10, the second row connection part SRLb, the third row connection part SRL1c, and the fourth row connection part SRLd may be connected to the first column connection part SCL1a of the first subsidiary column line SCL1, and the first row connection part SRL1a may be connected to the second subsidiary column line SCL2.

The second subsidiary row lines SRL2 may extend in the first direction (e.g., the ±x-direction). The second subsidiary row lines SRL2 may be connected to the second column connection parts SCL1b of the first subsidiary column lines SCL1 and the second subsidiary column lines SCL2.

The first subsidiary column lines SCL1 may extend in the second direction (e.g., the ±y-direction). The first subsidiary column lines SCL1 may each include a plurality of column connection parts spaced apart from each other by the second parts DWLb of the data connection lines DWL. For example, the first subsidiary column lines SCL1 may each include the first column connection part SCL1a and the second column connection part SCL1b spaced apart from each other by the second parts DWLb of the data connection line DWL. As described above with reference to FIG. 9, the first column connection parts SCL1a of the first subsidiary column lines SCL1 may be connected to the second driving voltage supply line 12 to receive the driving voltage ELVDD.

Although it is shown in FIG. 10 that the number of column connection parts of each of the first subsidiary column lines SCL1 is constant, the number of column connection parts of each of the first subsidiary column lines SCL1 may be different in one or more other embodiments. For example, like the first subsidiary row lines SRL1, the number of column connection parts of each of the first subsidiary column lines SCL1 may monotonically increase in the +x-direction.

The second subsidiary column lines SCL2 may extend in the second direction (e.g., the ±y-direction). As described above with reference to FIG. 9, the second subsidiary column lines SCL2 may be connected to the second driving voltage supply line 12 to receive the driving voltage ELVDD.

In some embodiments, the subsidiary row lines SRL and the subsidiary column lines SCL may be arranged on the same layer. The subsidiary row lines SRL and the subsidiary column lines SCL except the parts that are spaced apart from each other by the data connection line DWL may be one body. For example, as shown in FIG. 10, the first row connection parts SRL1a of the first subsidiary row lines SRL1, the second subsidiary row lines SRL2, the second column connection parts SCL1b of the first subsidiary column lines SCL1, and the second subsidiary column lines SCL2 may be one body. Also, the first column connection parts SCL1a of the first subsidiary column lines SCL1 and the rest of row connection parts of the first subsidiary row lines SRL1 may be one body.

In some embodiments, the first subsidiary row lines SRL1 and the second subsidiary row lines SRL2 may be arranged on each pixel circuit row, and the first subsidiary column lines SCL1 and the second subsidiary column lines SCL2 may be arranged on each pixel circuit column.

In some embodiments, as shown in FIG. 10, the second parts DWLb of the data connection lines DWL may be arranged on each pixel circuit row, and the third parts DWLc may be arranged on each pair of pixel circuit columns. In the case where the third parts DWLc of the data connection lines DWL are arranged on each pair of pixel circuit columns, the third parts DWLc of the data connection lines DWL may be arranged on the boundary between pixel circuits adjacent to each other, and an area that overlaps elements (e.g., transistors) inside the pixel circuit may be reduced. Accordingly, interference with the elements inside the pixel circuit may be reduced (e.g., prevented) by the third parts DWLc of the data connection lines DWL to which data voltages of various levels are applied.

Although it is shown in FIG. 10 that the third parts DWLc of the data connection lines DWL are arranged on each pair of pixel circuit columns, the third parts DWLc of the data connection lines DWL may be arranged on each pixel circuit column in one or more other embodiments. This is described below with reference to FIG. 13.

Figure 11:
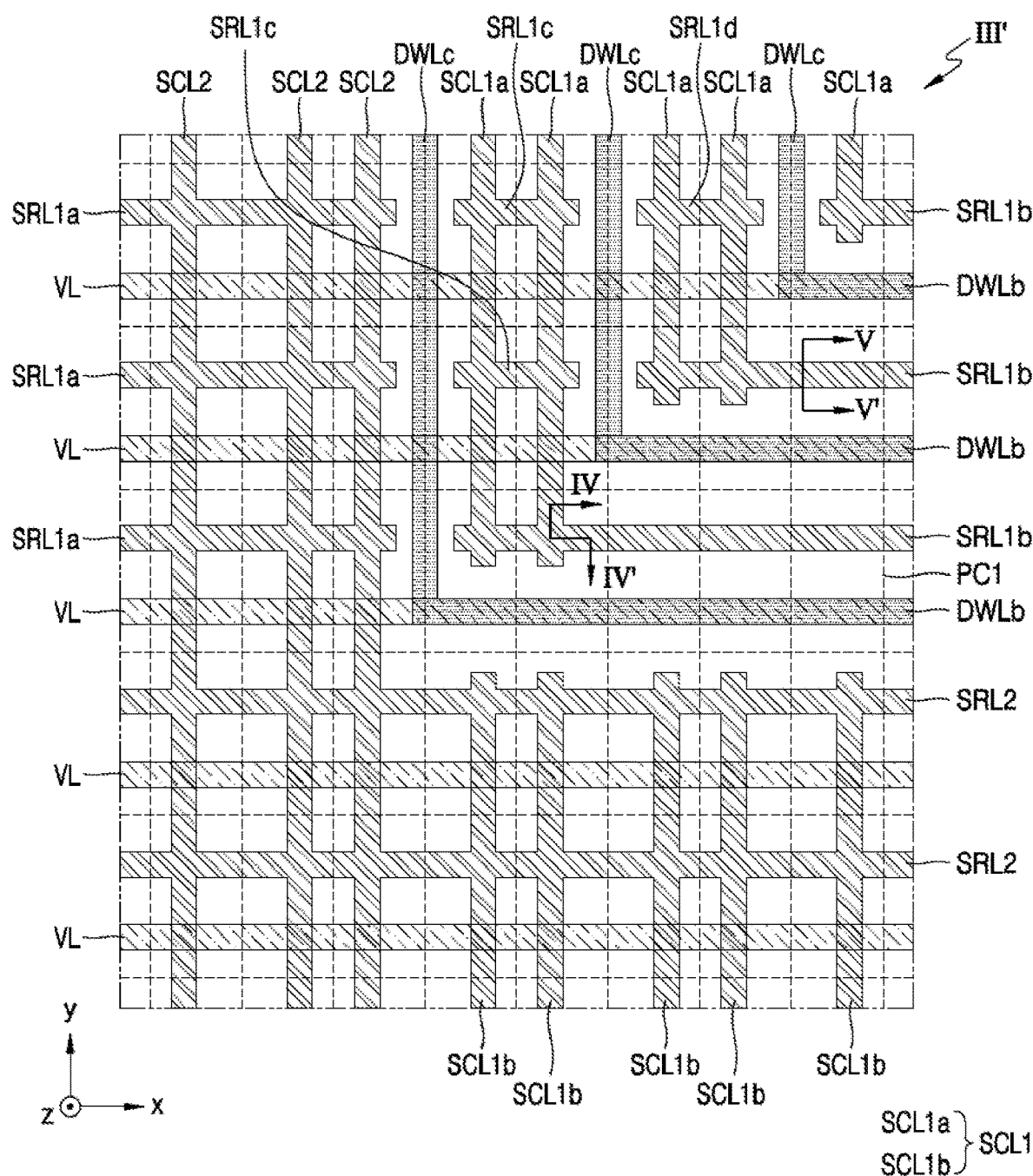
FIG. 11 is an enlarged plan view of a portion of FIG. 9 according to some embodiments.

FIG. 11 is an enlarged plan view of a portion of FIG. 9. FIG. 11 is a modified example of FIG. 10, and is different from FIG. 10 with respect to the structure of the data connection line. Hereinafter, contents that are already described with reference to FIG. 10 are omitted and the differences are mainly described.

Referring to FIG. 11, the display panel may include a plurality of initialization voltage lines VL extending in the first direction (e.g., the ±x-direction). The initialization voltage lines VL may be arranged on each pixel circuit row.

The initialization voltage line VL may be connected to the first pixel circuits PC1 on the same row among the plurality of first pixel circuits PC1, and may transfer the initialization voltage VINT (see FIG. 8) to the first pixel circuits PC1.

In some embodiments, as shown in FIG. 11, the second part DWLb of the data connection line DWL may overlap at least a portion of the initialization voltage line VL. Because the second parts DWLb of the data connection lines DWL overlap at least a portion of the initialization voltage line VL to which the initialization voltage VINT (e.g., a constant voltage) is applied, a likelihood of the elements inside the pixel circuit being interfered by the second parts DWLb of the data connection lines DWL to which data voltages of various levels are applied may be reduced or prevented.

Figure 12:
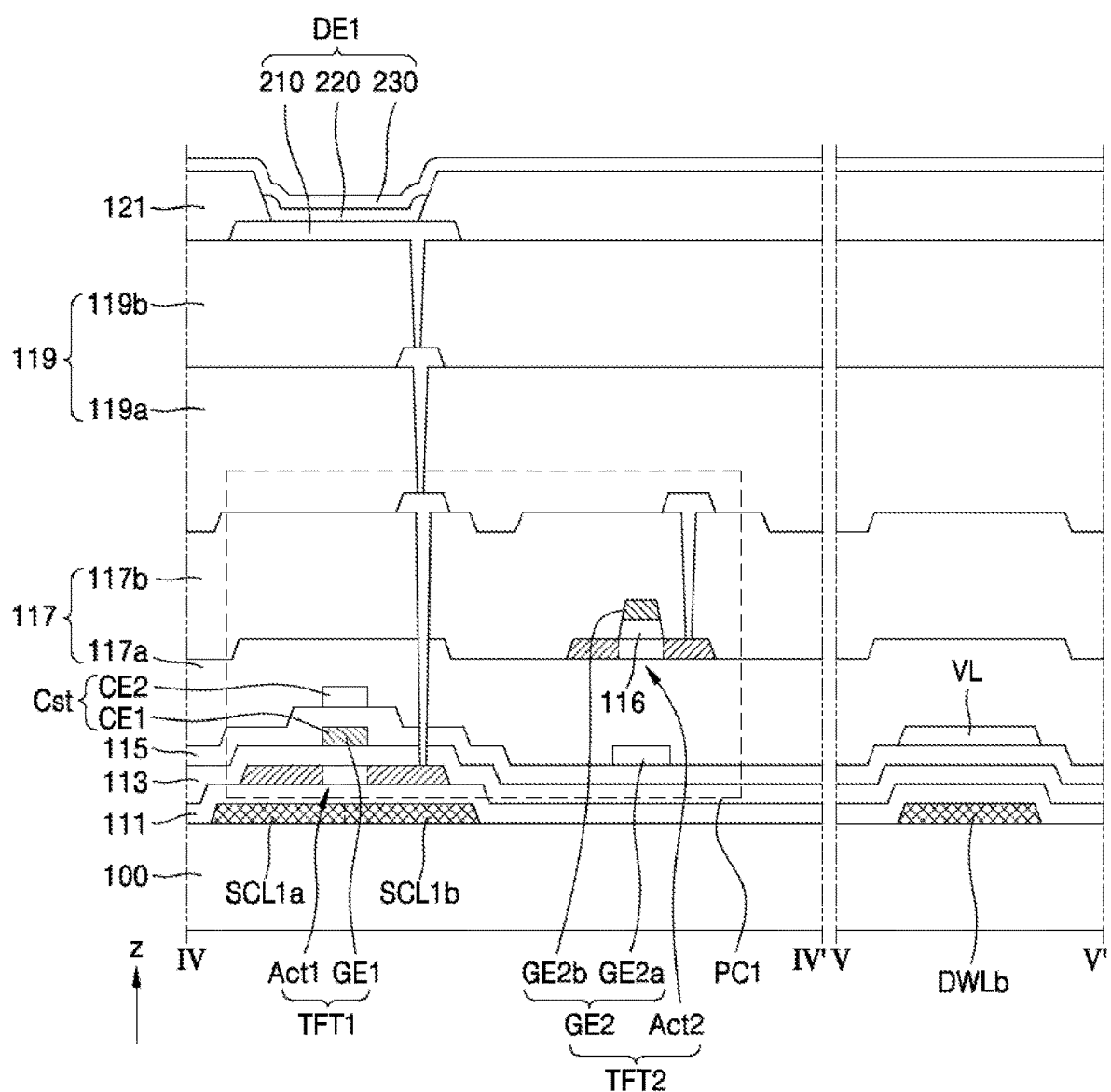
FIG. 12 is an example cross-sectional view of a pixel circuit of FIG. 11, taken along the lines IV-IV' and V-V' according to some embodiments.

FIG. 12 is an example cross-sectional view of a pixel circuit of FIG. 11, taken along the lines IV-IV' and V-V'.

Referring to FIG. 12, the first pixel circuit PC1 may include a first transistor TFT1 and a second transistor TFT2. The first transistor TFT1 may include a first semiconductor layer Act1 and a first gate electrode GE1. The second transistor TFT2 may include a second semiconductor layer Act2 and a second gate electrode GE2. The second gate electrode GE2 may include a lower gate electrode GE2a and an upper gate electrode GE2b. The first transistor TFT1 may correspond to the driving transistor T1 of FIG. 8, and the second transistor TFT2 may correspond to the compensation transistor T3 or the gate initialization transistor T4 of FIG. 8.

The first column connection part SCL1a of the first subsidiary column line SCL1, the second row connection part SRL1b of the first subsidiary row line SRL1, and the second part DWLb of the data connection line DWL may be arranged between (e.g., at one or more layers between) the substrate 100 and the buffer layer 111. The first column connection part SCL1a of the first subsidiary column line SCL1 and the second row connection part SRL1b of the first subsidiary row line SRL1 may be one body.

FIG. 12 shows the first column connection part SCL1a of the first subsidiary column line SCL1, the second row connection part SRL1b of the first subsidiary row line SRL1, and the second part DWLb of the data connection line DWL, for example. It may be understood that the first subsidiary column line SCL1, the first subsidiary row line SRL1, and the data connection line DWL are arranged between the substrate 100 and the buffer layer 111.

The first semiconductor layer Act1 may be arranged on the buffer layer 111. The first semiconductor layer Act1 may include amorphous silicon or polycrystalline silicon.

In some embodiments, as shown in FIG. 12, the first column connection part SCL1a of the first subsidiary column line SCL1 and the second row connection part SRL1b of the first subsidiary row line SRL1 may overlap at least a portion of the first semiconductor layer Act1. The first column connection part SCL1a of the first subsidiary column line SCL1 and the second row connection part SRL1b of the first subsidiary row line SRL1 may reduce (e.g., prevent) the characteristics of the first semiconductor layer Act1 from being changed by external light passing through the substrate 100.

The first gate insulating layer 113 may be arranged on the first semiconductor layer Act1, and the first gate electrode GE1 may be arranged on the first gate insulating layer 113 to overlap at least a portion of the first semiconductor layer Act1.

The second gate insulating layer 115 may be arranged on the first gate electrode GE1. The second electrode CE2 of the storage capacitor Cst, the lower gate electrode GE2a, and the initialization voltage line VL may be arranged on the second gate insulating layer 115. The second electrode CE2 of the storage capacitor Cst, the lower gate electrode GE2a, and the initialization voltage line VL may include at least one of molybdenum (Mo), aluminum (Al), copper (Cu), or titanium (Ti), and may have a single-layered structure or a multi-layered structure including the above materials. For example, the second electrode CE2 of the storage capacitor Cst, the lower gate electrode GE2a, and the initialization voltage line VL may each be a single molybdenum (Mo) layer.

In some embodiments, the initialization voltage line VL may overlap the second part DWLb of the data connection line DWL. Because the second part DWLb of the data connection line DWL overlaps the initialization voltage line VL to which a constant voltage is applied, the elements inside the pixel circuit may be reduced (e.g., prevented) from being interfered by the second part DWLb of the data connection line DWL to which data voltages of various levels are applied.

The interlayer insulating layer 117 may include a first interlayer insulating layer 117a and a second interlayer insulating layer 117b. The first interlayer insulating layer 117a may be arranged on (e.g., above) the second electrode CE2 of the storage capacitor Cst, the lower gate electrode GE2a, and the initialization voltage line VL. The second interlayer insulating layer 117b may be arranged on the first interlayer insulating layer 117a.

The second semiconductor layer Act2 may be arranged on the first interlayer insulating layer 117a. The second semiconductor layer Act2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn).

In some embodiments, as shown in FIG. 12, the lower gate electrode GE2a may overlap at least a portion of the second semiconductor layer Act2. The lower gate electrode GE2a may reduce (e.g., prevent) change of the characteristics of the second semiconductor layer Act2 due to external light passing through the substrate 100.

A third gate insulating layer 116 may be arranged on the second semiconductor layer Act2. The third gate insulating layer 116 may include silicon oxide ($SiO_2$), silicon nitride ($SiN_x$), silicon oxynitride (SiON), aluminum oxide ($Al_2O_3$), titanium oxide (TiO$_2$), tantalum oxide (Ta$_2$O$_5$), hafnium oxide (HfO$_2$), or zinc oxide (ZnO$_x$). ZnO$_x$ may be ZnO or ZnO$_2$.

In some embodiments, the third gate insulating layer 116 may be patterned to overlap a portion of the second semiconductor layer Act2. In other embodiments, the third gate insulating layer 116 may not be patterned and may correspond to the upper surface of the substrate 100 to cover the second semiconductor layer Act2.

The upper gate electrode GE2b may be arranged on the third gate insulating layer 116. The upper gate electrode GE2b may include at least one of molybdenum (Mo), aluminum (Al), copper (Cu), or titanium (Ti), and may have a single-layered structure or a multi-layered structure including the above materials. For example, the upper gate electrode GE2b may be a single molybdenum (Mo) layer.

Figure 13:
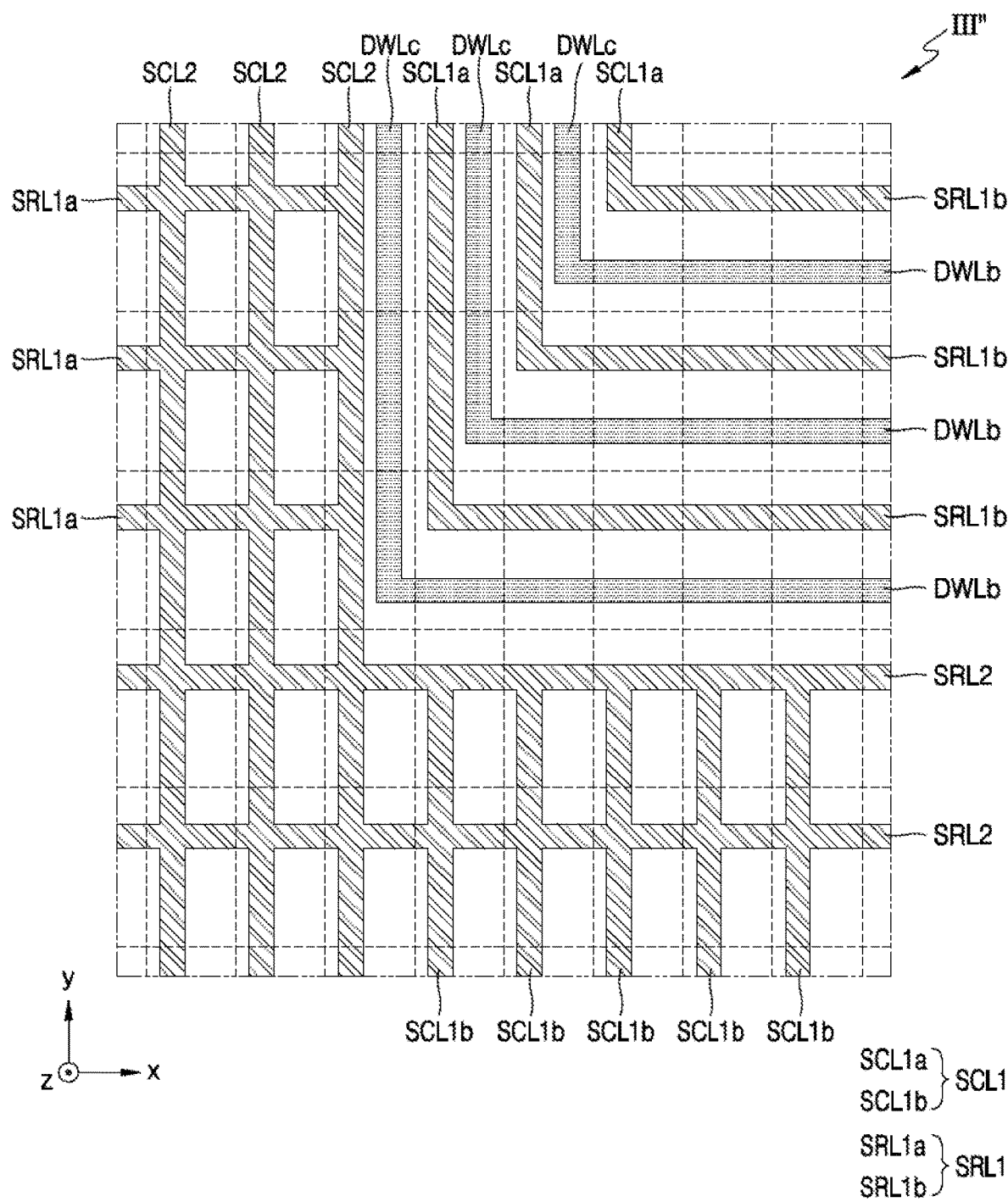
FIG. 13 is an enlarged plan view of a portion of FIG. 9 according to some embodiments.

FIG. 13 is an enlarged plan view of a portion of FIG. 9. FIG. 13 is a modified example of FIG. 10, and is different from FIG. 10 with respect to the structure of the data connection line. Hereinafter, contents that are already described with reference to FIG. 10 are omitted and the differences are mainly described.

Referring to FIG. 13, the first subsidiary row lines SRL1 and the second subsidiary row lines SRL2 may be arranged on each pixel circuit row, and the first subsidiary column lines SCL1 and the second subsidiary column lines SCL2 may be arranged on each pixel circuit column. In addition, the second parts DWLb of the data connection lines DWL may be arranged on each pixel circuit row, and the third parts DWLc of the data connection lines DWL may be arranged on each pixel circuit column.

The first subsidiary row lines SRL1 may extend in the first direction (e.g., the ±x-direction). The first subsidiary row lines SRL1 may each include a plurality of row connection parts spaced apart from each other by the third parts DWLc of the data connection lines DWL. For example, the first subsidiary row lines SRL1 may each include the first row connection part SRL1a and the second row connection part SRL1b spaced apart from each other by the third parts DWLc of the data connection lines DWL (e.g., with the third parts DWLc of the data connection lines DWL therebetween).

The first subsidiary column lines SCL1 may extend in the second direction (e.g., the ±y-direction). The first subsidiary column lines SCL1 may each include a plurality of column connection parts spaced apart from each other by the second parts DWLb of the data connection lines DWL. For example, the first subsidiary column lines SCL1 may each include the first column connection part SCL1a and the second column connection part SCL1b spaced apart from each other by the second parts DWLb of the data connection lines DWL.

Although the display apparatus has been mainly described, the embodiments are not limited thereto. For example, a method of manufacturing a display apparatus also falls within the scope of the present disclosure.

According to various embodiments, conductive patterns arranged in a portion of the display area may not be visible (e.g., viewed or noticed by a user) under external light. However, the scope of the present disclosure is not limited by this effect.

It should be understood that the embodiments described herein should be considered in a descriptive sense only and not for purposes of limitation. Descriptions of features or aspects within one or more embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a substrate comprising a display area, and a peripheral area outside the display area;
   a semiconductor layer on the substrate;
   a first pixel circuit at the display area;
   a first data line at the display area, and connected to the first pixel circuit;
   a second pixel circuit at the peripheral area;
   a second data line at the peripheral area, and connected to the second pixel circuit; and
   a data connection line between the substrate and the semiconductor layer, and connecting the first data line to the second data line.

2. A display apparatus comprising:
   a substrate comprising:
      a display area comprising a component area, and a main area surrounding at least a portion of the component area, a transmittance of the component area being greater than a transmittance of the main area; and
      a peripheral area outside the display area;
   a semiconductor layer on the substrate;
   a first pixel circuit at the display area;
   a first data line at the display area, and connected to the first pixel circuit;
   a second pixel circuit at the peripheral area;
   a second data line at the peripheral area, and connected to the second pixel circuit; and
   a data connection line between the substrate and the semiconductor layer, connecting the first data line to the second data line, and overlapping at least a portion of the component area.

3. The display apparatus of claim 2, further comprising a camera below the component area,
   wherein the component area comprises a central region corresponding to a lens of the camera, and an edge region surrounding the central region, and
   wherein the data connection line overlaps at least a portion of the edge region.

4. The display apparatus of claim 2, wherein the data connection line comprises:
   a first part overlapping the component area;
   a second part connected to the first part, extending in a first direction, and overlapping at least a portion of the main area; and
   a third part connected to the second part, extending in a second direction, and overlapping at least a portion of the main area.

5. The display apparatus of claim 4, further comprising a voltage line on the semiconductor layer, extending in the first direction, and connected to the first pixel circuit,
   wherein the second part of the data connection line overlaps at least a portion of the voltage line.

6. The display apparatus of claim 5, further comprising a first display element at the display area, and connected to the first pixel circuit,
   wherein the first pixel circuit comprises:
   a driving transistor configured to control a current flowing through the first display element; and an initialization transistor connected to the voltage line, and configured to apply an initialization voltage from the voltage line to a gate of the driving transistor according to a scan signal.

7. The display apparatus of claim 6, wherein a conduction type of the driving transistor is opposite to a conduction type of the initialization transistor.

8. The display apparatus of claim 4, wherein the first pixel circuit comprises a plurality of first pixel circuits in a matrix shape,
wherein the data connection line comprises a plurality of data connection lines,
wherein the second parts of the data connection lines are at respective rows of the first pixel circuits, and
wherein the third parts of the data connection lines are at respective columns or at respective pairs of columns of the first pixel circuits.

9. The display apparatus of claim 4, further comprising:
a subsidiary row line extending in the first direction, and comprising a first row connection part and a second row connection part spaced apart from each other with the third part of the data connection line therebetween; and
a subsidiary column line extending in the second direction, and comprising a first column connection part and a second column connection part spaced apart from each other with the second part of the data connection line therebetween.

10. The display apparatus of claim 9, wherein a driving voltage of a same level is applied to each of the subsidiary row line and the subsidiary column line.

11. The display apparatus of claim 1, further comprising:
a first display element at the display area and connected to the first pixel circuit; and
a second display element at the display area and connected to the second pixel circuit,
wherein an emission area of the second display element is greater than an emission area of the first display element.

12. The display apparatus of claim 11, further comprising:
a third pixel circuit at the display area; and
a third display element at the display area and connected to the third pixel circuit,
wherein the display area comprises:
a component area comprising a first region and a second region adjacent to each other; and
a main area surrounding a portion of the component area,
wherein the first pixel circuit and the first display element are at the main area, and partially overlap each other,
wherein the second display element is at the first region of the component area,
wherein the third pixel circuit and the third display element are at the second region of the component area, and partially overlap each other, and
wherein an emission area of the third display element is greater than an emission area of the first display element.

13. The display apparatus of claim 12, wherein the first display element comprises a plurality of first display elements,
wherein the second display element comprises a plurality of second display elements,
wherein the third display element comprises a plurality of third display elements,
wherein a number of the first display elements per unit area is greater than a number of the second display elements per unit area, and
wherein the number of the second display elements per unit area is same as a number of the third display elements per unit area.

14. A display apparatus comprising:
a substrate in which a display area, and a peripheral area that is outside the display area are defined, the display area comprising a component area, and a main area that surrounds at least a portion of the component area;
a buffer layer above the substrate;
first pixel circuits at the main area above the buffer layer;
first display elements at the main area, and respectively connected to the first pixel circuits;
first data lines at the main area, and respectively connected to the first pixel circuits;
second pixel circuits at the peripheral area;
second display elements at the component area, and respectively connected to the second pixel circuits;
second data lines at the peripheral area, and respectively connected to the second pixel circuits; and
data connection lines below the buffer layer, overlapping at least a portion of the component area, and respectively connecting the first data lines and the second data lines,
wherein a number of the first display elements per unit area is greater than a number of the second display elements per unit area.

15. The display apparatus of claim 14, further comprising a camera below the component area,
wherein the component area comprises a central region corresponding to a lens of the camera, and an edge region surrounding the central region, and
wherein the data connection lines overlap at least a portion of the edge region.

16. The display apparatus of claim 14, wherein the data connection lines comprise:
a first part overlapping the component area;
a second part connected to the first part, extending in a first direction, and overlapping at least a portion of the main area; and
a third part being connected to the second part, extending in a second direction, and overlapping at least a portion of the main area.

17. The display apparatus of claim 16, further comprising voltage lines at the main area, extending in the first direction, and respectively connected to the first pixel circuits at a same row,
wherein the second parts respectively overlap at least a portion of the voltage lines.

18. The display apparatus of claim 17, wherein the first pixel circuits comprise:
a driving transistor configured to control a current flowing through a corresponding first display element among the first display elements; and
an initialization transistor configured to transfer an initialization voltage from a corresponding voltage line among the voltage lines to a gate of the driving transistor according to a scan signal.

19. The display apparatus of claim 16, wherein the second parts are respectively at rows of the first pixel circuits, and
wherein the third parts are either respectively at columns of the first pixel circuits or respectively at pairs of adjacent columns of the first pixel circuits.

20. The display apparatus of claim 16, further comprising:
subsidiary row lines extending in the first direction, and comprising row connection parts spaced apart from each other with a corresponding third part therebetween; and
subsidiary column lines extending in the second direction, and comprising column connection parts spaced apart from each other with a corresponding second part therebetween,
wherein a driving voltage of a same level is applied to the subsidiary row lines and the subsidiary column lines.

21. The display apparatus of claim 20, wherein a number of the row connection parts of the subsidiary row lines monotonically increases in the second direction.

* * * * *